United States Patent
Lue et al.

(10) Patent No.: US 9,620,217 B2
(45) Date of Patent: Apr. 11, 2017

(54) SUB-BLOCK ERASE

(71) Applicant: Macronix International Co., Ltd., Hsinchu (TW)

(72) Inventors: Hang-Ting Lue, Hsinchu (TW); Kuo-Pin Chang, Miaoli (TW)

(73) Assignee: Macronix International Co., Ltd., Hsinchu, Taiwan (TW)

( * ) Notice: Subject to any disclaimer, the term of this patent is extended or adjusted under 35 U.S.C. 154(b) by 121 days.

(21) Appl. No.: 14/668,790

(22) Filed: Mar. 25, 2015

(65) Prior Publication Data

US 2016/0049201 A1 Feb. 18, 2016

Related U.S. Application Data

(60) Provisional application No. 62/036,203, filed on Aug. 12, 2014.

(51) Int. Cl.
| | |
|---|---|
| *G11C 16/14* | (2006.01) |
| *G11C 16/08* | (2006.01) |
| *G11C 16/04* | (2006.01) |
| *G11C 16/16* | (2006.01) |

(Continued)

(52) U.S. Cl.
CPC .......... *G11C 16/08* (2013.01); *G11C 16/0483* (2013.01); *G11C 16/16* (2013.01); *H01L 27/11551* (2013.01); *H01L 27/11578* (2013.01); *G11C 2216/18* (2013.01)

(58) Field of Classification Search
CPC .................................................. G11C 16/14
See application file for complete search history.

(56) References Cited

U.S. PATENT DOCUMENTS

| | | |
|---|---|---|
| 6,906,940 B1 | 6/2005 | Lue |
| 7,315,474 B2 | 1/2008 | Lue |
| 7,420,242 B2 | 9/2008 | Lung |

(Continued)

FOREIGN PATENT DOCUMENTS

EP     2048709 A2     4/2009

OTHER PUBLICATIONS

European Search Report for European Application No. 15168157.4 dated Jan. 7, 2016, 8 pages.

(Continued)

*Primary Examiner* — Tri Hoang
(74) *Attorney, Agent, or Firm* — Yiding Wu; Haynes Beffel & Wolfeld LLP

(57) ABSTRACT

A method is provided for operating a NAND array that includes a plurality of blocks of memory cells. A block of memory cells in the plurality of blocks includes a plurality of NAND strings having channel lines between first string select switches and second string select switches. The plurality of NAND strings shares a set of word lines between the first and second string select switches. A channel-side erase voltage is applied to the channel lines through the first string select switches in a selected block. Word line-side erase voltages are applied to a selected subset including more than one member of the set of word lines shared by NAND strings in the selected block to induce tunneling in memory cells coupled to the selected subset, while tunneling is inhibited in memory cells coupled to an unselected subset including more than one member of the set of word lines.

18 Claims, 13 Drawing Sheets

(51) Int. Cl.
  *H01L 27/11551* (2017.01)
  *H01L 27/11578* (2017.01)

(56) References Cited

U.S. PATENT DOCUMENTS

| | | | |
|---|---|---|---|
| 7,696,559 | B2 | 4/2010 | Arai et al. |
| 7,851,849 | B2 | 12/2010 | Kiyotoshi |
| 8,278,170 | B2 | 10/2012 | Lee et al. |
| 8,363,476 | B2 | 1/2013 | Lue et al. |
| 8,467,219 | B2 | 6/2013 | Lue |
| 8,503,213 | B2 | 8/2013 | Chen et al. |
| 8,759,899 | B1 | 6/2014 | Lue et al. |
| 8,976,600 | B2 | 3/2015 | Hung et al. |
| 2005/0018489 | A1 | 1/2005 | Hosono |
| 2005/0280061 | A1 | 12/2005 | Lee |
| 2007/0045708 | A1 | 3/2007 | Lung |
| 2007/0252201 | A1 | 11/2007 | Kito et al. |
| 2008/0061355 | A1 | 3/2008 | Choi |
| 2008/0073635 | A1 | 3/2008 | Kiyotoshi et al. |
| 2008/0175032 | A1 | 7/2008 | Tanaka et al. |
| 2008/0180994 | A1 | 7/2008 | Katsumata et al. |
| 2009/0097321 | A1 | 4/2009 | Kim et al. |
| 2009/0184360 | A1 | 7/2009 | Jin et al. |
| 2010/0148220 | A1* | 6/2010 | Byeon ............ H01L 27/105 257/208 |
| 2010/0270593 | A1 | 10/2010 | Lung et al. |
| 2011/0305088 | A1 | 12/2011 | Huang et al. |
| 2012/0051136 | A1* | 3/2012 | Kang ............ G11C 16/344 365/185.17 |
| 2012/0119283 | A1 | 5/2012 | Lee et al. |
| 2012/0182806 | A1 | 7/2012 | Chen et al. |
| 2013/0007353 | A1 | 1/2013 | Shim et al. |
| 2014/0192594 | A1* | 7/2014 | Lue ............ G11C 16/10 365/185.11 |
| 2014/0254284 | A1 | 9/2014 | Hung et al. |
| 2014/0362644 | A1 | 12/2014 | Lue et al. |
| 2015/0206899 | A1 | 7/2015 | Chen |

OTHER PUBLICATIONS

Chen et al., "A Highly Pitch Scalable 3D Vertical Gate (VG) NAND Flash Decoded by a Novel Self-Aligned Independently Controlled Double Gate (IDG) String Select Transistor (SSL)," 2012 Symp. on VLSI Technology (VLSIT), Jun. 12-14, 2012, pp. 91-92.

Choi et al., "Performance Breakthrough in NOR Flash Memory with Dopant-Segregated Schottky-Barrier (DSSB) SONOS Devices", 2009 Symposium on VLSI Technology Digest of Technical Papers, p. 222-223.

Fukuzumi et al. "Optimal Integration and Characteristics of Vertical Array Devices for Ultra-High Density, Bit-Cost Scalable Flash Memory," IEEE Dec. 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Jung et al., "Three Dimensionally Stacked NAND Flash Memory Technology Using Stacking Single Crystal Si Layers on ILD and TANOS Structure for Beyond 30nm Node," IEEE IEDM Dec. 11-13, 2006, 4 pages.

Katsumata, et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Lue et al., "A Highly Scalable 8-Layer 3D Vertical-Gate (VG) TFT NAND Flash Using Junction-Free Buried Channel BE-SONOS Device", 2010 Symposium on VLSI Technology Digest of Technical Papers, pp. 131-132, Jun. 15-17, 2010.

Nowak et al., "Intrinsic fluctuations in Vertical NAND flash memories," 2012 Symposium on VLSI Technology, Digest of Technical Papers, pp. 21-22, Jun. 12-14, 2012.

Tanaka H., et al., "Bit Cost Scalable Technology with Punch and Plug Process for Ultra High Density Flash Memory," 2007 Symp. VLSI Tech., Digest of Tech. Papers, pp. 14-15.

U.S. Appl. No. 14/582,963, filed Dec. 24, 2014 by Shih-Hung Chen, 35 pages.

U.S. Appl. No. 14/284,306 entitled "3D Independent Double Gate Flash Memory," filed May 21, 2014, 60 pages.

Wang, Michael, "Technology Trends On 3D-NAND Flash Storage", Impact 2011, Taipei, dated Oct. 20, 2011, found at www.impact.org.tw/2011/Files/NewsFile/201111110190.pdf.

* cited by examiner

SUB-BLOCK ERASE

RELATED APPLICATIONS

This application claims the benefit of U.S. Provisional Patent Application No. 62/036,203 filed on 12 Aug. 2014, which application is incorporated by reference as if fully set forth herein.

BACKGROUND

Field of the Technology

The present technology relates to high density memory devices, and particularly the operation of devices using stacked memory structures.

Description of Related Art

As critical dimensions of devices in integrated circuits shrink toward perceived limits of manufacturing technologies, designers have been looking to techniques to achieve greater storage capacity, and to achieve lower costs per bit. Technologies being pursued include multiple layers of memory cells on a single chip. Operations performed on a 3D (three-dimensional) NAND memory having multiple layers of memory cells include read, write and erase.

Typically, erase operations are performed by blocks of memory cells, where the general issue of high density NAND, and in particular high density 3D NAND, memories is that the size of a block of memory cells is often very large. This is not convenient if a user only needs to change the code of a small unit stored in a 3D NAND memory. As the density of 3D NAND memories increases, the number of layers in the stacks increase, leading to larger block sizes and further inconvenience in erase operations.

Thus, it is desirable to provide for a technology with more efficient and convenient erase operations in 3D NAND memories.

SUMMARY

A method is provided for sub-block erase in an NAND array, where a sub-block can include a half of the memory cells in a block, or another portion of the block as explained below. The term "block" as used herein is a set of NAND strings operated simultaneously during an erase operation, and in which all the NAND strings are connected to a reference voltage during the erase operation, usually via a line called a common source line in response to a shared control signal usually called a ground select signal on a ground select line GSL, even though the reference line may be coupled to potentials other than ground. Also, all the NAND strings in a block are connected to a shared set of word lines. The bit lines in a block can be connected to the NAND strings individually in response to a control signal usually called a string select signal on a set of string select lines SSLs. In a block erase operation, all the string select signals for a selected block are operated simultaneously to cause erase of the complete block. Also, blocks are often configured on an integrated circuit so that they can be electrically isolated from adjacent blocks for the purposes of a block erase operation, such as by being separated from one another by insulating structures.

A method is described for operating a NAND array that includes a plurality of blocks of memory cells, which includes a sub-block erase operation. The method is applicable to both single layer NAND arrays and multilayer or 3D NAND arrays.

In operating methods described herein, a sub-block can be erased that includes the memory cells that share a subset of the set of word lines of the block, where the subset includes more than one member. In this manner, some of the memory cells in all of the NAND strings in the block are erased. The erase operation can be configured therefore to erase a unit smaller than a block of the memory array, increasing operational flexibility.

A block can be logically or physically divided into two or more sub-blocks for the purposes of a sub-block erase operation, using biasing arrangements of the word lines, while the ground select signal and all the string select signals for the block are set to select the block. The word lines can be biased in the selected block to cause erase of a sub-block and to inhibit erase of the remainder of the block. One or more word lines can be operated in a boundary mode which is different from an inhibit mode applied to other word lines, which serves to support the erase of the sub-block.

In one operating method described herein channel-side erase voltage is applied to the channel lines of the NAND strings in a selected block through the first string select switches. Word line-side erase voltages are applied to a selected subset of the set of word lines shared by NAND strings in the selected block to induce tunneling in memory cells coupled to the selected subset, where the selected subset includes more than one member of the set of word lines, while tunneling is inhibited in memory cells coupled to an unselected subset of the set of word lines shared by NAND strings in the selected block, where the unselected subset includes more than one member of the set of word lines. Inhibiting tunneling can include floating word lines in the unselected subset when the channel-side erase voltage is applied.

A bias voltage can be applied on a boundary word line in the set of word lines, to induce boundary conditions, between the selected subset on one side of the boundary word line and the unselected subset on another side of the boundary word line. The boundary conditions can include electric fields for generation of holes in sub-block erase operations.

Word lines in the set of word lines are coupled to word line drivers. In one implementation, a first control voltage can be applied to turn on word line drivers for word lines in the selected subset, to apply the word line-side erase voltage to the selected subset. A second control voltage can be applied to turn off word line drivers for word lines in the unselected subset, when a global word line voltage matching the second control voltage is applied to inputs of the word line drivers for word lines in the unselected subset. The first control voltage is different than the second control voltage. For instance, the first control voltage can be higher than the second control voltage. A third control voltage can be applied to turn on a word line driver for the boundary word line when the bias voltage is applied on the boundary word line, where the third control voltage is between the first control voltage and the second control voltage.

In another implementation, a control voltage is applied to turn on word line drivers for word lines in the selected subset, when the word line-side erase voltage is applied to the selected subset. The same control voltage is applied to turn off word line drivers for word lines in the unselected subset, when a global word line voltage matching the control voltage is applied to inputs of the word line drivers for word lines in the unselected subset. The same control voltage can be applied to turn on a word line driver for the boundary word line, to apply the bias voltage on the boundary word line, where the bias voltage is between the word line-side erase voltage and the global word line voltage.

The channel lines can include a drain side with an N+ type terminal connected to the first string select switches, and the source side with a P+ type terminal connected to the second string select switches. A source-side voltage can be applied to the source side of the channel lines, holes can be provided to the channel lines of the NAND strings, and a channel potential can be raised along the channel lines.

In response to a command to erase memory cells coupled to the selected subset of the set of word lines in the selected block, a channel-side erase voltage can be applied to the channel lines of the NAND strings through the first string select switches in a selected block, word line-side erase voltages can be applied to a selected subset of the set of word lines shared by NAND strings in the selected block to induce tunneling in memory cells coupled to the selected subset, tunneling can be inhibited in memory cells coupled to an unselected subset of the set of word lines shared by NAND strings in the selected block, and a bias voltage can be applied on a boundary word line in the set of word lines, to induce boundary conditions, between the selected subset of the set of word lines on one side of the boundary word line and the unselected subset of the set of word lines on another side of the boundary word line.

Other aspects and advantages of the present technology can be seen on review of the drawings, the detailed description and the claims, which follow.

DETAILED DESCRIPTION

Figure 1:
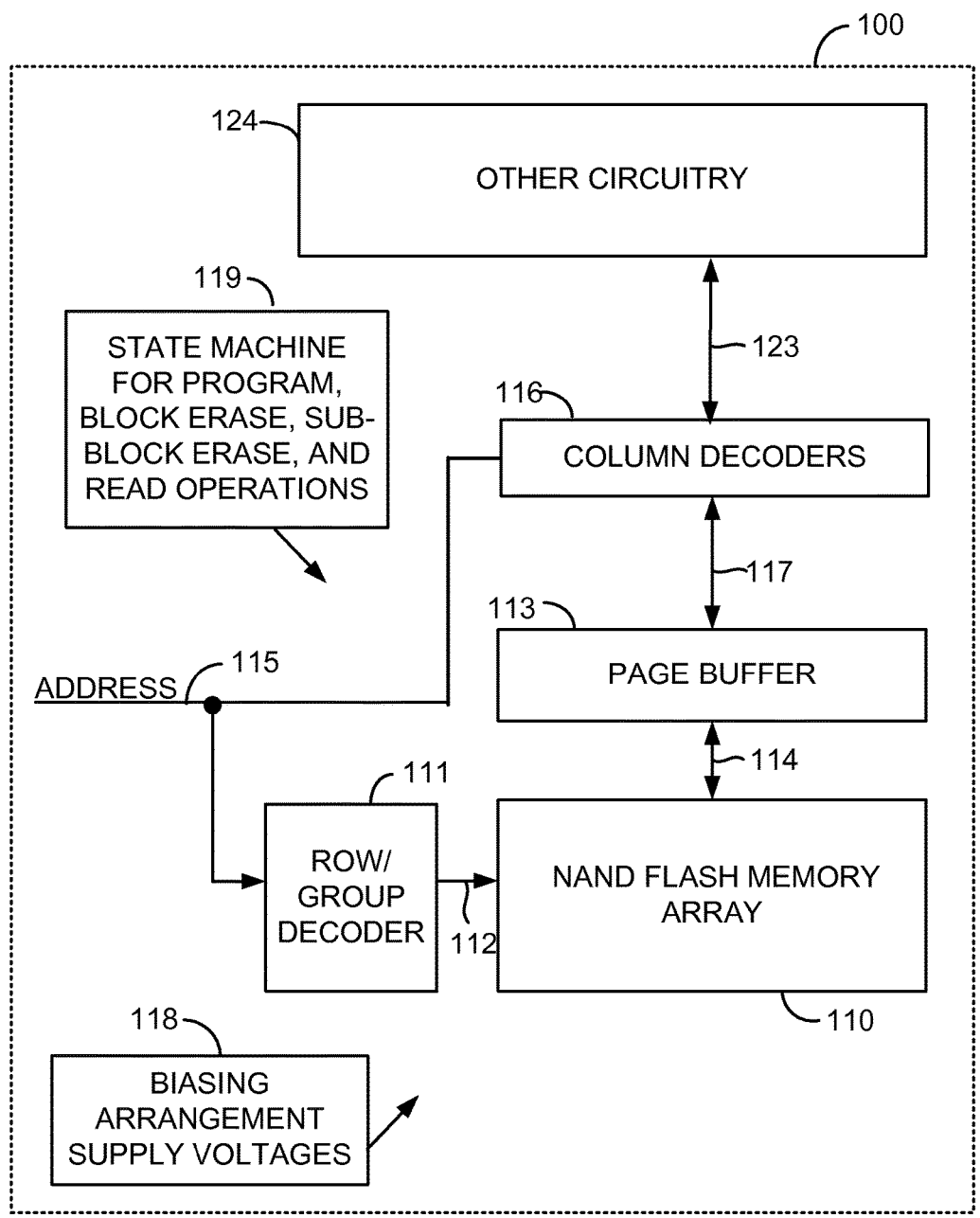
FIG. 1 is a simplified block diagram of an integrated circuit memory employing memory cells and bias circuitry according to embodiments of the present technology.

A detailed description of embodiments of the present technology is provided with reference to the Figures. It is to be understood that there is no intention to limit the technology to the specifically disclosed structural embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows. Like elements in various embodiments are commonly referred to with like reference numerals.

FIG. 1 is a simplified block diagram of an integrated circuit 100 including a NAND flash memory array 110 which can be operated as described herein. In some embodiments, the array 110 is a 3D memory and includes multiple layers of cells. The array can include a plurality of blocks of memory cells, where a block of memory cells can include a plurality of NAND strings having channel lines between first string select switches and second string select switches. The plurality of NAND strings shares a set of word lines between the first and second string select switches.

A row decoder 111 is coupled to a plurality of word lines 112 arranged along rows in the memory array 110. The row decoder can include a set of local word line drivers that drives respective word lines in the set of word lines in a selected block of memory cells. The set of local word line drivers can include a first subset of the set of local word line drivers driving a first subset of the set of word lines, a second subset of the set of local word line drivers driving a second subset of the set of word lines, and a boundary word line driver driving a boundary word line in the set of word lines between the first subset of the set of word lines and the second subset of the set of word lines.

The memory includes a set of global word lines, including first global word lines connected to the first subset of the set of local word line drivers, and a second global word line connected to the boundary word line driver. In one implementation, the memory includes a global word line driver driving the first global word lines, and the first global word lines are also connected to the second subset of the set of local word line drivers. In an alternative implementation, the set of global word lines includes third global word lines connected to the second subset of the set of local word line drivers, and the memory includes a first global word line driver driving the first global word lines, and a third global word line driver driving the third global word lines.

Column decoders in block 116 are coupled to a set of page buffers 113, in this example via data bus 117. The global bit lines 114 are coupled to the set of page buffers 113 and to local bit lines (not shown) arranged along columns in the memory array 110. Addresses are supplied on bus 115 to column decoder (block 116) and row decoder (block 111). Data is supplied via the data-in line 123 from other circuitry 124 (including for example input/output ports) on the integrated circuit, such as a general purpose processor or special purpose application circuitry, or a combination of modules providing system-on-a-chip functionality supported by the array 110. Data is supplied via the data-in line 123 to input/output ports or to other data destinations internal or external to the integrated circuit 100.

A controller, implemented in this example as a state machine (e.g. 119), is coupled to the blocks of memory cells, and provides signals to control the application of bias arrangement supply voltages generated or provided through the voltage supply or supplies in block 118 to carry out the various operations described herein on data in the array. These operations include program, block erase, sub-block erase, and read. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

The controller can include logic to execute sub-block erase operations described herein. For instance, the controller can include logic to bias a sub-block of memory cells for negative Fowler-Nordheim (-FN) tunneling to inject holes into the charge storage structures of cells in the selected sub-block, thereby reducing the threshold voltages, at least in cells of the sub-block that do not already have a low threshold voltage.

In one implementation, the controller can include logic to apply a channel-side erase voltage to the channel lines of the NAND strings through the first string select switches in the selected block, logic to apply word line-side erase voltages to a first subset including more than one member of the set of word lines shared by NAND strings in the selected block to induce tunneling in memory cells coupled to the first subset, and logic to inhibit tunneling in memory cells coupled to a second subset including more than one member of the set of word lines. The logic to inhibit tunneling can include logic to float word lines in the second subset when applying the channel-side erase voltage.

The controller can include logic to apply a bias voltage on a boundary word line in the set of word lines, to induce boundary conditions, between the first subset on one side of the boundary word line and the second subset on another side of the boundary word line. The boundary conditions can include electric fields for generation of holes in sub-block erase operations.

The channel lines in the NAND strings can include a drain side with an N+ type terminal connected to the first string select switch, and a source side with a P+ type terminal connected to the second string select switch. A source-side voltage can be applied to the source side of the channel line in the selected block, holes can be provided to the channel line, and a channel potential can be raised along the channel line. The source-side voltage can match the channel-side erase voltage.

For clarity purposes, the term "program" as used herein refers to an operation which increases the threshold voltage of a memory cell. The data stored in a programmed memory cell can be represented as a logical "0" or logical "1." The term "erase" as used herein refers to an operation which decreases the threshold voltage of a memory cell. The data stored in an erased memory cell can be represented as the inverse of the programmed state, as a logical "1" or a logical "0." Also, multibit cells can be programmed to a variety of threshold levels, and erased to a single lowest threshold level. Further, the term "write" as used herein describes an operation which changes the threshold voltage of a memory cell, and is intended to encompass both program and erase, or a combination of program and erase operations.

Figure 2:
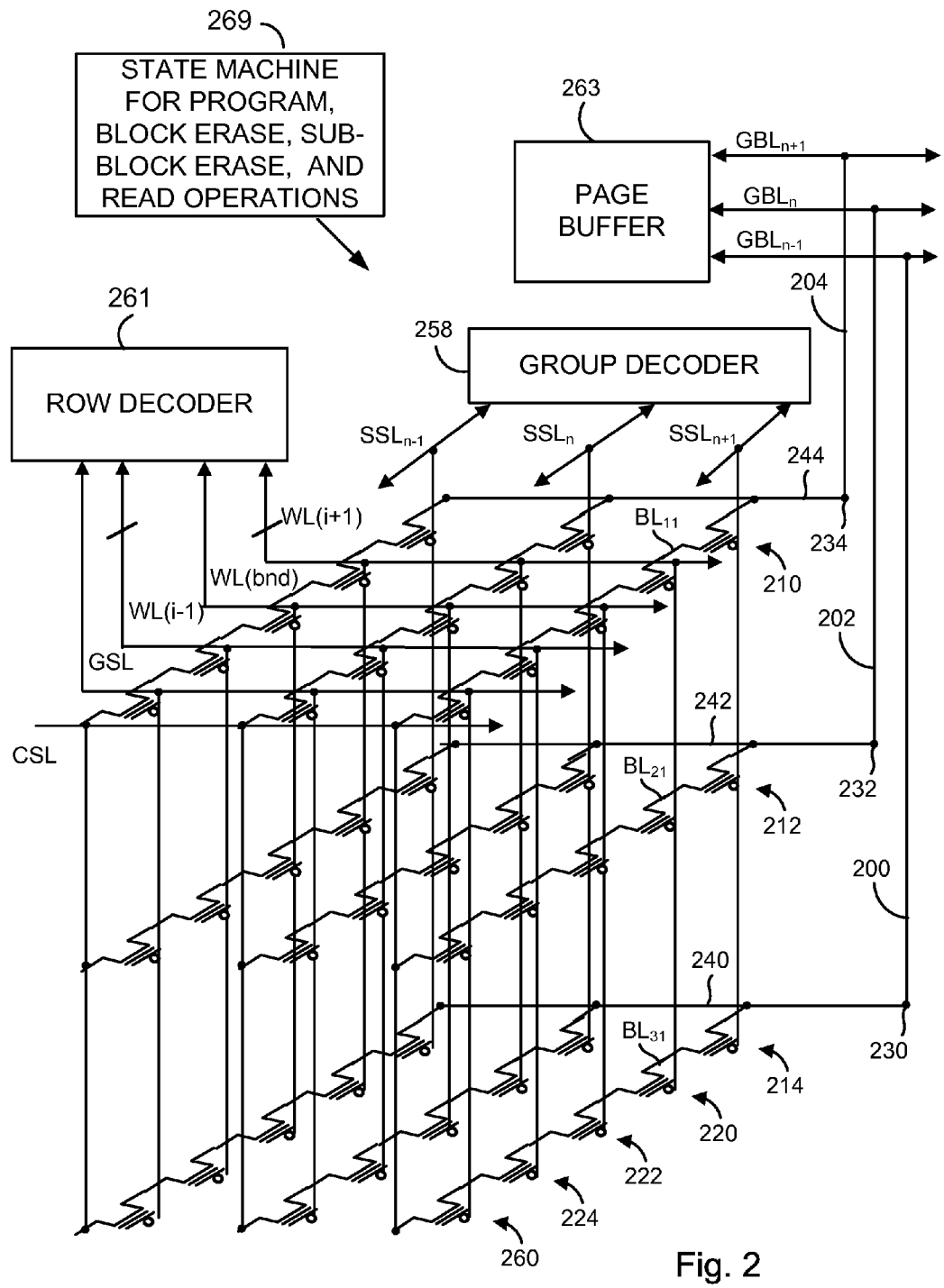
FIG. 2 is a schematic diagram of a portion of the 3D NAND flash memory array usable in a device like that of FIG. 1.

FIG. 2 is a schematic diagram of a portion of the 3D NAND flash memory array usable in a device like that of FIG. 1. In this example, three layers of memory cells are illustrated, which is representative of a block of p-channel memory cells that can include many layers.

Figure 5:
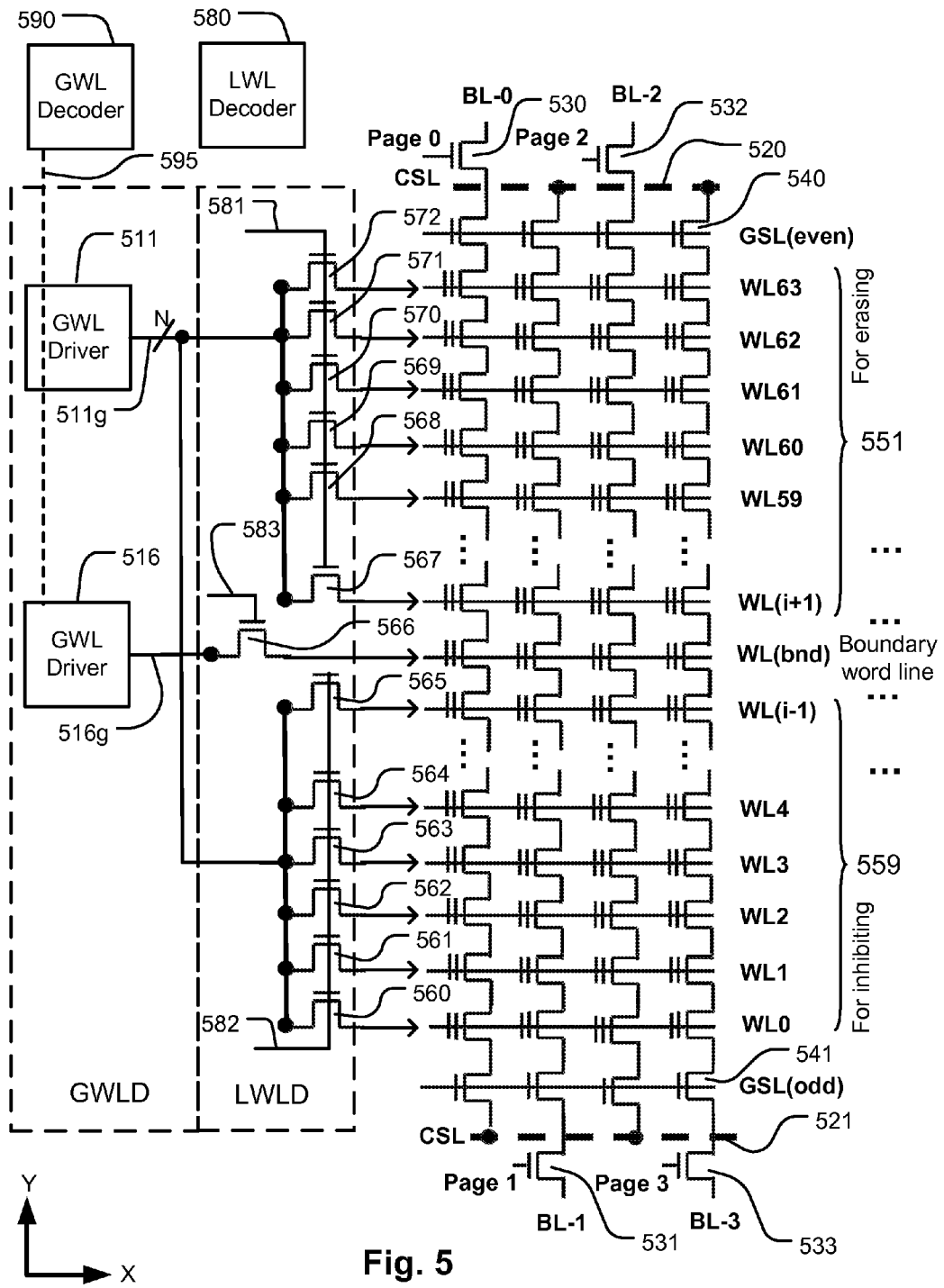
FIG. 5 is a circuit diagram showing example NAND strings in an X-Y plane in a block of memory cells connected to a configuration of local and global word line drivers.
Figure 6:
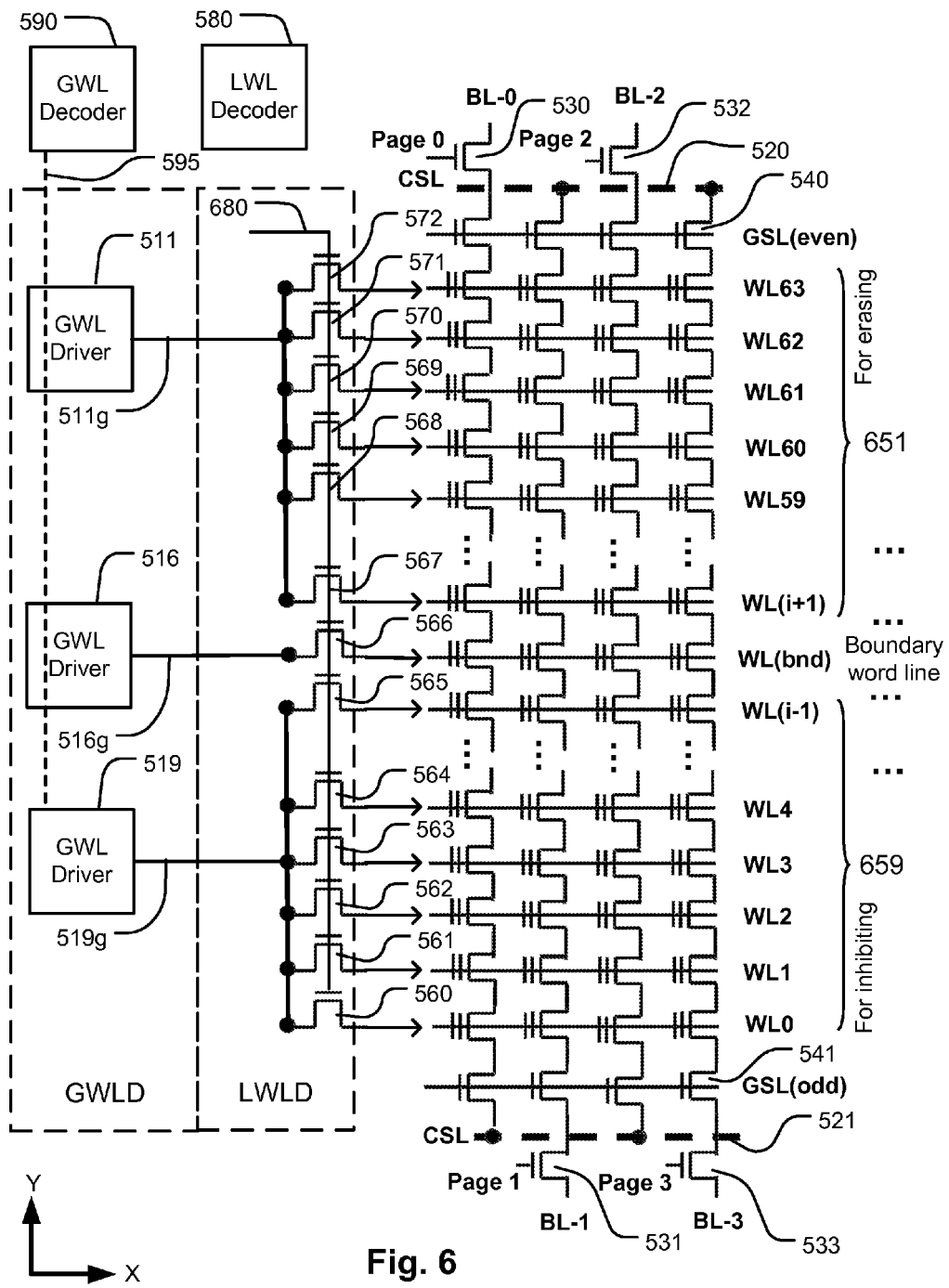
FIG. 6 is a circuit diagram showing example NAND strings in an X-Y plane in a block of memory cells connected to an alternative configuration of local and global word line drivers.

A plurality of word lines including word lines WL0 to WL(i−1), WL(bnd), WL(i+1) to WL63 extend in parallel along a first direction. The word lines WL(i−1), WL(bnd), WL(i+1) are shown in FIG. 2. The word lines WL0 to WL(i−1), WL(bnd), WL(i+1) to WL63 are shown in FIG. 5 and FIG. 6. The word lines are in electrical communication with row decoder 261, which can include the global word line decoder 590 and local word line decoder 580 as shown in FIG. 5 and FIG. 6. The word lines are connected to the gates of the memory cells, which are arranged in series as NAND strings. As shown in FIG. 2, each word line is vertically connected to the gates of the memory cells in each of the various layers underlying the word line.

A boundary word line (e.g. WL(bnd)) is disposed between a first subset of the set of word lines including more than one member of the set of word lines including word lines WL(i+1), . . . WL59-WL63, and a second subset of the set of word lines including more than one member of the set of word lines including word lines WL0-WL4, . . . WL(i−1), as shown in FIGS. 5 and 6. Sub-block erase operations including using the boundary word line are described in connection with FIGS. 5-6 and 11-12.

Although a first subset, a second subset and a boundary word line of a set of word lines are shown for a block of memory cells in FIG. 2 and FIGS. 4, 5, 6, 9 and 10, the technology described herein can divide a set of word lines in a block of memory cells into more than two subsets with more than one boundary word lines, such as four subsets with three boundary word lines, eight with seven boundary word lines, sixteen subsets with fifteen boundary word lines, . . . , and so on.

A plurality of local bit lines is arranged along columns to form NAND strings in the various layers of the memory array. As shown in FIG. 2, the array includes a local bit line $BL_{31}$ on the third layer, a local bit line $BL_{21}$ on the second layer, and a local bit line $BL_{11}$ on the first layer. The memory cells have dielectric charge trapping structures between the corresponding word lines and the corresponding local bit lines. In this illustration, there are three memory cells in a NAND string for simplicity. For example, a NAND string formed by local bit line $BL_{31}$ on the third layer includes memory cells 220, 222, 224. In a typical implementation, a NAND string can include 16, 32, 64 or more memory cells, connected to 16, 32, 64 or more word lines respectively.

A plurality of string select lines including string select lines $SSL_{n-1}$, $SSL_n$, $SSL_{n+1}$ are in electrical communication with group decoder 258 (which could be part of the row decoder 261), which selects a group of strings. The string select lines are connected to the gates of first string select switches arranged at the first ends of the memory cell NAND strings. As shown in FIG. 2, each of the string select lines are vertically connected to the gates of a column of the string select switches in each of the various layers. For example, string select line $SSL_{n+1}$ is connected to the gates of string select switches SSL 210, 212, 214 in the three layers.

The local bit lines on a particular layer are selectively coupled to an extension which can be implemented using a bit line pad as described herein, on the particular layer by the corresponding string select switches. For example, the local bit lines on the third layer are selectively coupled to extension 240 by the corresponding string select switches in that layer. Similarly, the local bit lines on the second layer are selectively coupled to extension 242, and local bit lines on the first layer are selectively coupled to extension 244.

The extensions on each of the layers include a corresponding contact pad for contact with a vertical connector coupled to a corresponding global bit line. For example, extension 240 in the third layer is coupled to a global bit line $GBL_{n-1}$ via contact pad 230 and vertical connector 200. Extension 242 on the second layer is coupled to a global bit line $GBL_n$ via contact pad 232 and vertical connector 202. Extension 244 on the third layer is coupled to a global bit line $GBL_{n+1}$ via contact pad 234 and vertical connector 204.

The global bit lines $GBL_{n-1}$, $GBL_n$, and $GBL_{n+1}$ are coupled to additional blocks (not shown) in the array and extend to page buffer 263.

Block select transistors (sometimes referred to as second string select switches) are arranged at the second ends of the NAND strings. For example, block select switch 260 is arranged at the second end of the NAND string formed by memory cells 220, 222, 224. A ground select line GSL is connected to the gates of the block select switches. The ground select line GSL is in electrical communication with the row decoder 261 to receive bias voltages during operations described herein.

The block select transistors are used to selectively couple second ends of all the NAND strings in the block to a common source line CSL. The common source line CSL receives bias voltages from the bias circuit (not shown here) during operations described herein. In some operations described herein, the CSL is biased to a reference voltage that is higher in absolute magnitude than that of a bit line coupled to the opposite end of a NAND string, rather than in the more traditional "source" role.

The blocks can be arranged in an array of blocks, including rows of blocks and columns of blocks. Blocks in a row can share the same sets of word lines WL0 to WL(i−1), WL(bnd), WL(i+1) to WL63 and ground select lines GSL. Blocks in a column can share the same sets of global bit lines $GBL_{n-1}$, $GBL_n$, and $GBL_{n+1}$. In this manner, a 3D decoding network is established, selected memory cells which are part of a page can be accessed using one word line, and a set of global bit lines $GBL_{n-1}$, $GBL_n$, and $GBL_{n+1}$ and one string select line deliver data from cells selected in each layer in parallel on the set of global bit lines $GBL_{n-1}$, $GBL_n$, and $GBL_{n+1}$.

The array shown in FIG. 2 includes p-channel NAND strings implemented in a horizontal configuration, with all the cells in a given string on the same layer of the array. In alternative 3D arrangements, the NAND strings can be implemented in a vertical configuration. In some embodiments, the NAND strings are junction-free, in which there are no p-type terminals between the cells. P-type terminals can be implemented only on the sides of the SSL transistors (e.g. 210) that are connected to the bit line extensions (e.g. line 244), and on the sides of the GSL switches (e.g. 260) that are connected to the common source line CSL. A state machine 269 is shown that is configured to control the memory array and supporting circuitry to perform program, block erase, sub-block erase and read operations.

Figure 3:
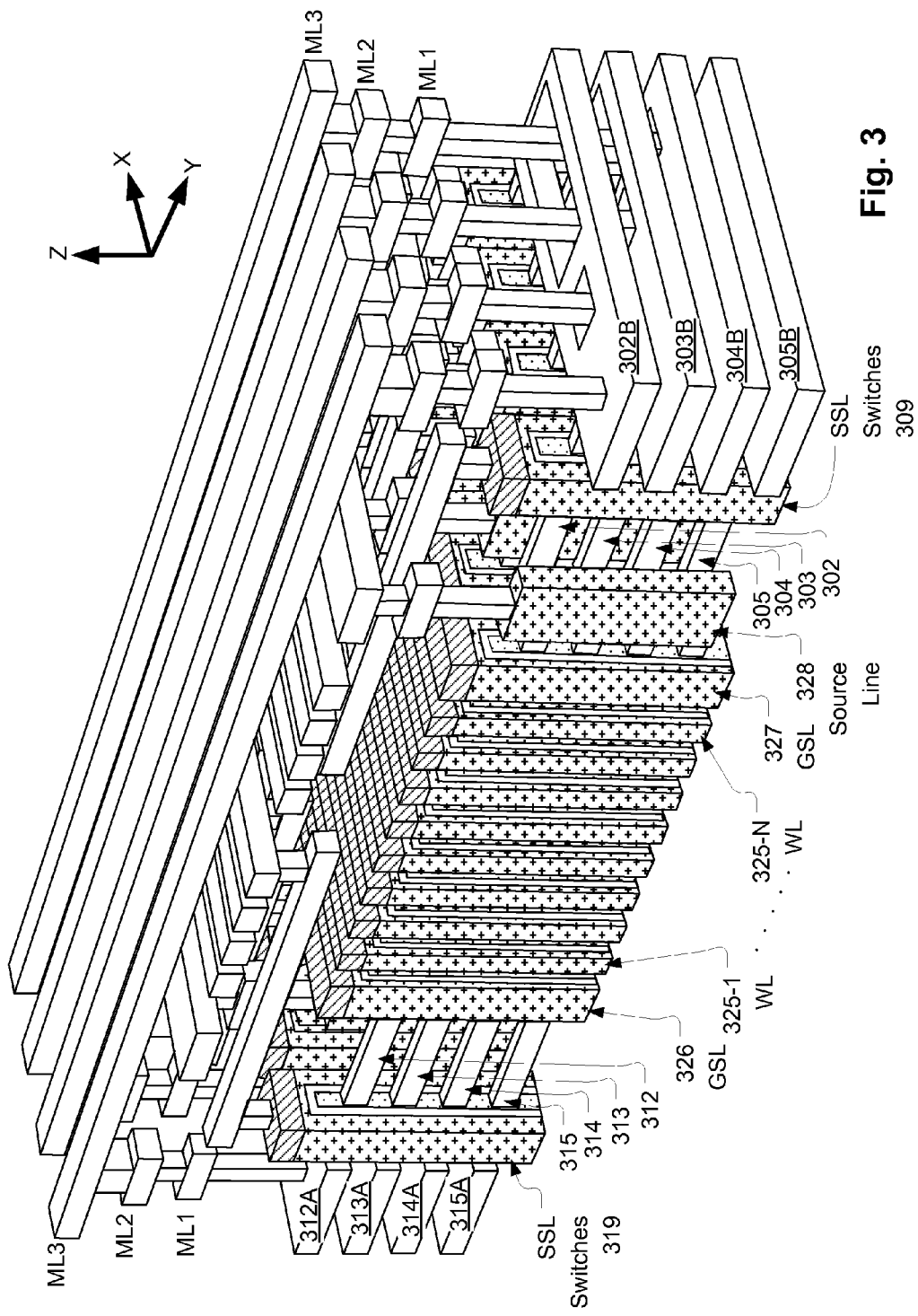
FIG. 3 is a perspective illustration of a 3D unit including even and odd blocks of memory cells including stacks of layers of NAND strings in a 3D vertical gate (3DVG) NAND-flash memory array structure.

FIG. 3 is a perspective illustration of a 3D unit including even and odd blocks (as defined above) of memory cells including stacks of layers of NAND strings in a 3D vertical gate (3DVG) NAND-flash memory array structure. The 3D NAND-flash memory array structure is described in commonly owned U.S. Pat. No. 8,503,213 issued 6 Aug. 2013, which is hereby incorporated by reference as if fully set forth herein. Insulating material is removed from the drawing to expose additional structure. For example, insulating layers are removed between the NAND strings in the stacks, and are removed between the stacks of NAND strings.

Alternative 3D NAND structures can be referred to as vertical channel NAND arrays, such as those described in our co-pending application Ser. No. 14/284,306 filed 21 May 2014, and application Ser. No. 14/582,963 filed 24 Dec. 2014, which are incorporated by reference as if fully set forth herein. Vertical channel NAND arrays also include blocks as described herein, and can be configured and operated for sub-block erase using the biasing techniques described herein.

The 3D NAND-flash memory array in both the vertical channel and vertical gate structures includes stacked memory structures resulting in the array having a plurality of memory cells disposed in a dense configuration.

In the vertical gate example shown in FIG. 3, the block of the multilayer array is formed on an insulating layer, and includes a plurality of word lines 325-1, . . . , 325-N. The stacks include channel lines (e.g. 312, 313, 314, 315 in the first even page stack). The stack of channel lines 312, 313, 314, 315 is terminated at one end by the stairstep pads 312A, 313A, 314A, 315A, and passes through SSL switches 319, ground select line GSL 326, word lines 325-1 WL through 325-N WL, ground select line GSL 327, and terminates at the other end by source line 328. The stack of channel lines 312, 313, 314, 315 does not reach the stairstep pads 302B, 303B, 304B, 305B. Thus, the even block shares the even ground select line GSL and all the word lines, and the odd block shares the odd ground select line GSL and all the word lines. The even and odd blocks are interleaved in this example, allowing a unit that is N strings wide to operate with N/2 bit lines. Because of the proximity of the interleaved strings of memory cells in the even and odd blocks, the even and odd page blocks in this configuration can be operated together for an erase operation. Other embodiments do not use interleaved even and odd stacks.

The stack of channel lines 302, 303, 304, 305 in the first odd page stack, is terminated at one end by the stairstep pads 302B, 303B, 304B, 305B, and passes through SSL switches 309, ground select line GSL 327, word lines 325-N WL through 325-1 WL, ground select line GSL 326, and terminates at the other end by a source line (obscured by other parts of the figure). The stack of channel lines 302, 303, 304, 305 does not reach the stairstep pads 312A, 313A, 314A, 315A.

The shown word line numbering, ascending from 1 to N going from the back to the front of the overall structure, applies for a sequence going from SLL to GSL on even memory pages. For odd memory pages, the word line numbering descends from N to 1 going from the front to the back of the overall structure, applies for a sequence going from SSL to GLS on odd memory pages.

Stairstep pads 312A, 313A, 314A, 315A terminate channel lines in even pages, such as channel lines 312, 313, 314, 315. As illustrated, these stairstep pads 312A, 313A, 314A, 315A are electrically connected to different bit lines for connection to decoding circuitry to select layers of memory cells within the array. These stairstep pads 312A, 313A, 314A, 315A can be patterned at the same time that the plurality of stacks are defined.

Stairstep pads 302B, 303B, 304B, 305B terminate channel lines in odd pages, such as channel lines 302, 303, 304, 305. As illustrated, these stairstep pads 302B, 303B, 304B, 305B are electrically connected to different bit lines for connection to decoding circuitry to select layers of memory cells within the array. These stairstep pads 302B, 303B, 304B, 305B can be patterned at the same time that the plurality of stacks are defined.

Any given stack of channel lines is coupled to either the stairstep pads 312A, 313A, 314A, 315A on one end of the block, or the stairstep pads 302B, 303B, 304B, 305B on the other end of the block, but not both. Other blocks in an array of blocks can be electrically isolated from one another by the use of separate stacks of channel lines and stairstep pads that connect the channel lines in a block together, with insulating material disposed between them the separated stacks. In this way, the separate blocks can be operated independently for erase, if their control signals are separately decoded.

Ground select lines GSL 326 and GSL 327 are conformal with the plurality of stacks, similar to the word lines.

Every stack of channel lines is terminated at one end by a set of stairstep pads, and at the other end by a source line. For example, the stack of channel lines 312, 313, 314, 315 is terminated at one end by stairstep pads 312A, 313A, 314A, 315A, and terminated on the other end by source line 328. At the near end of the figure, every other stack of channel lines is terminated by the stairstep pads 302B, 303B, 304B, 305B, and every other stack of channel lines is terminated by a separate source line. At the far end of the figure, every other stack of channel lines is terminated by the stairstep pads 312A, 313A, 314A, 315A, and every other stack of channel lines is terminated by a separate source line.

Bit lines and string select lines are formed at the metals layers ML1, ML2, and ML3. Local bit lines for each string of memory cells are formed by the channel lines.

Memory cell transistors are formed with memory material between the channel lines and the word line 325-1 through 325-N. In the transistors, the channel line (e.g. 313) acts as the channel region of the device. SSL switches (e.g. 319, 309) are patterned during the same step that the word lines 325-1 through 325-N are defined. A layer of silicide can be formed along the top surface of the word lines, the ground select lines, and over the gate structures. A layer of memory material can act as the gate dielectric for the transistors. These transistors act as string select gates coupled to decoding circuitry for selecting particular stacks in the array.

A general issue of 3D NAND memories is that the size of a block of memory cells is often very large. As the density of 3D NAND memories increases, the number of layers in the stacks increases, leading to larger block sizes and slower timing specification for block erase operations. The slower timing specification for block erase operations degrades the performance of a 3D NAND memory when a user only needs to change the code of a small unit stored in a sub-block of memory cells in the 3D NAND memory.

In the present technology, a set of word lines shared by a plurality of NAND strings can be divided into a first subset and a second subset of the set of word lines, allowing memory cells coupled to one of the first subset and the second subset to be erased, while inhibiting tunneling in memory cells coupled to the other one of the first subset and the second subset. Consequently, only some but not all memory cells in a block are erased in a sub-block erase operation, thus enabling faster timing specification for sub-block erase operations than for block erase operations and enhancing the performance of a 3D NAND memory.

Figure 4:
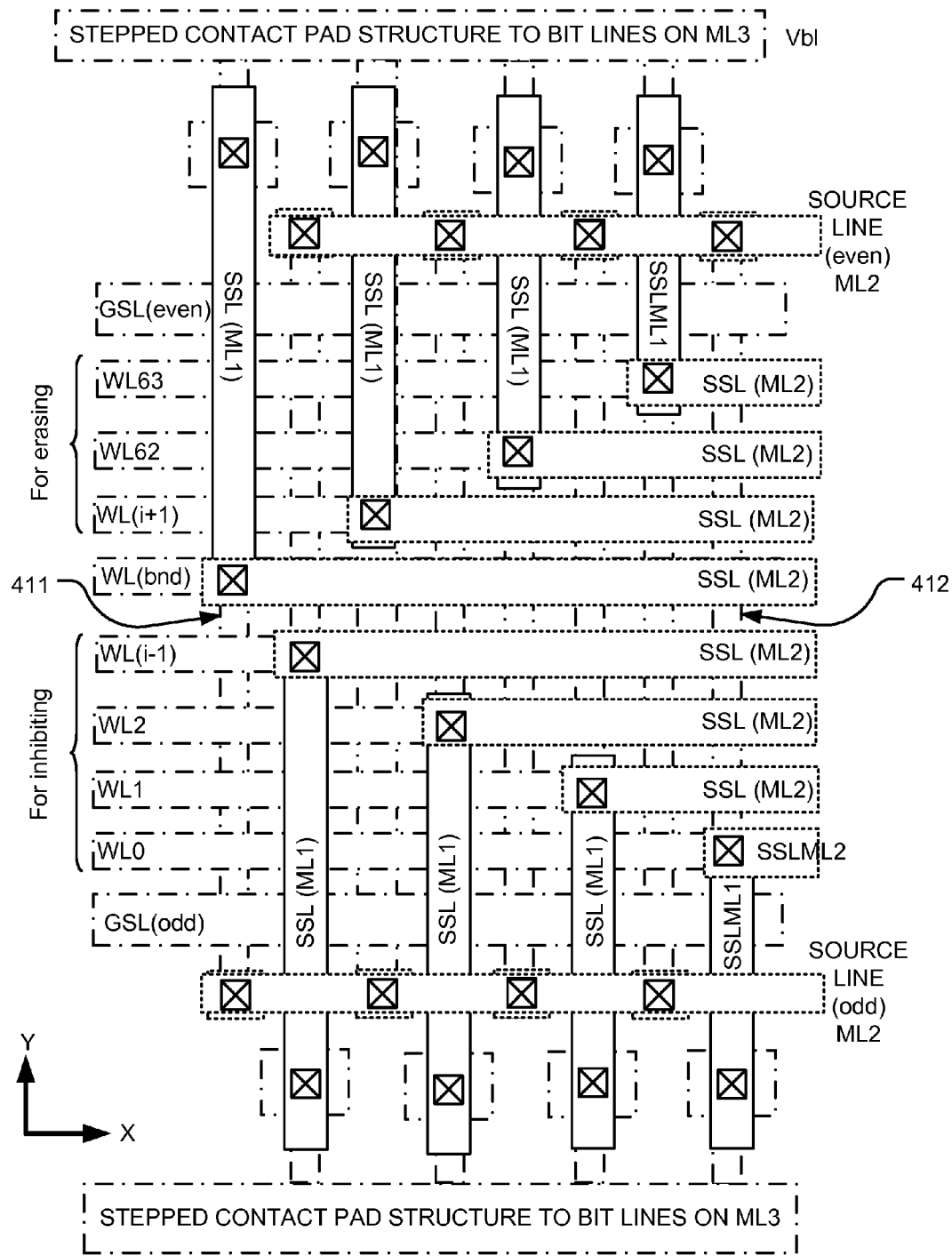
FIG. 4 is an example layout view of the 3D NAND-flash memory array structure of FIG. 3.

FIG. 4 is an example layout view of the 3D NAND-flash memory array structure of FIG. 3. The 3D NAND-flash memory array structure includes a plurality of blocks of memory cells. A block of memory cells includes a plurality of NAND strings having channel lines between first string select switches (e.g. SSL) and second string select switches (e.g. GSL), and in which the plurality of NAND strings shares a set of word lines (e.g. WL0-WL63) between the first and second string select switches.

In the layout view of FIG. 4, stacks of channel lines are shown as vertical strips with dot-dash borders. Adjacent stacks of channel lines alternate between the even and odd orientations. Every odd stack of channel lines (e.g. 411) runs from the bit line contact pad structure at the top to the odd source line at the bottom. Every even stack of channel lines (e.g. 412) runs from the bit line contact pad structure at the bottom to the even source line structure at the top.

Overlying the stacks of channel lines, are the horizontal word lines and the horizontal ground select lines GSL (even) and GSL (odd). Also overlying the stacks of channel lines, are the SSL switches. The odd SSL switches overlie every other stack of channel lines at the top end of the channel lines, and the even SSL switches overlie every other stack of channel lines at the bottom end of the channel lines. In either case, the SSL switches control electrical connection between any stack of channel lines and the stack's corresponding bit line contact stairstep pads.

As shown in the example of FIG. 4, a plurality of word lines including word lines WL0 to WL(i−1), WL(bnd), WL(i+1) to WL63 extend in parallel along a first direction. The word lines WL0 to WL2, WL(i−1), WL(bnd), WL(i+1), WL62 to WL63 are shown in FIG. 2. The word lines WL0 to WL(i−1), WL(bnd), WL(i+1) to WL63 are shown in FIG. 5 and FIG. 6. The word lines are in electrical communication with row decoder 161 (FIG. 2). The word lines are connected to the gates of the memory cells, which are arranged in series as NAND strings.

A boundary word line (e.g. WL(bnd)) is disposed between a first subset of the set of word lines for erasing including word lines WL(i+1), . . . WL62-WL63, and a second subset of the set of word lines for inhibiting including word lines WL0-WL2, . . . WL(i−1). Sub-block erase operations including using the boundary word line are described in connection with FIGS. 5-6 and 11-12.

Overlying the word lines, ground select lines, and SSL switches, are the ML1 SSL string select lines running vertically. Overlying the ML1 SSL string select lines are the ML2 SSL string select lines running horizontally. Although the ML2 SSL string select lines are shown as terminating at corresponding ML1 SSL string select lines for ease of viewing the structure, the ML2 SSL string select lines may run longer horizontally. The ML2 SSL string select lines carry signals from the decoder, and the ML1 SSL string select lines couple these decoder signals to particular SSL switches to select particular stacks of channel lines.

Also overlying the ML1 SSL string select lines are the source lines, even and odd.

Further, overlying the ML2 SSL string select lines are the ML3 bit lines (not shown) which connect to the stepped contact structures at the top and the bottom. Through the stepped contact structures, the bit lines select particular layers of channel lines.

Particular bit lines can be electrically connected to different layers of channel lines. The SSLs of the particular bit lines can be biased to connect the particular bit lines to different layers of channel lines.

Under a sub-block erase bias arrangement, a channel-side erase voltage can be applied to a plurality of bit lines, and the plurality of bit lines is connected to the channel lines (e.g. 411, 412) of a plurality of NAND strings in a block of memory cells, where the plurality of NAND strings shares a set of word lines (e.g. WL0-WL2, WL(i−1), WL(bnd), WL(i+1), WL62-WL63). A bias voltage can be applied on a boundary word line (e.g. WL(bnd)) in the set of word lines, to induce boundary conditions. A word line-side erase voltage can be applied to a first subset of the set of word lines (e.g. WL(i+1)-WL63) on one side of the boundary word line (WL(bnd)) to induce hole tunneling in memory cells coupled to the first subset. Hole tunneling is inhibited in memory cells coupled to a second subset of the set of word lines (e.g. WL0-WL2, WL(i−1)). Inhibiting the hole tunneling can include floating word lines in the second subset when applying the channel-side erase voltage.

In the vertical gate 3D structure of FIG. 3, the memory includes a plurality of pages of memory cells, where a page can be defined, for the purpose of this description, in this structure as including the memory cells in one stack of channel lines, selected by a single SSL switch, where each channel line is coupled to a corresponding bit line via the stairstep pads. An array page can be defined as a plurality of pages from different blocks operated in parallel. The definition of a page and the decoding applied to access a page can vary as suits a particular memory architecture. The memory structure can include a page program buffer to which the set of N bit lines is coupled in parallel, for use in the program and program verify steps described herein. In the illustrated example, there are four layers of memory cells, which provides for four bit lines per page. In other examples there are other numbers of layers. In one example considered herein, there can be eight layers, with eight even stacks and eight odd stacks, making a memory block including a total of 16 pages of eight bits each.

The memory unit can be repeated left and right, to establish wider array pages, that include with four bits from each page in a row of blocks being selected by each word line that traverses the row of blocks. For a representative configuration storing N*8 megabytes of data in a row of blocks, an integrated circuit may include 8000 global bit lines, overlying rows of 1000 side-by-side blocks of cells each of which have sixteen pages of 512 N-bit cells coupled to eight global bit lines in the even/odd arrangement. Each row of blocks may have 64 word lines, and have a depth of eight layers making 256 cells in each of the even and odd blocks. Thus, a single eight layer strip selected by an SSL signal in a single block, will include 512 cells (**64\*8**), each storing multiple bits of data. A block of sixteen such strips will have 8K cells.

Conventionally, erase operations are performed by blocks of memory cells, where each block includes many stacks of NAND strings. A general issue of 3D NAND memories is that the size of a block of memory cells is often very large. As the density of 3D NAND memories increases, the number of layers in the stacks increases, leading to larger block sizes, and thus slower timing specification for block erase operations. The slower timing specification for block erase operations degrades the performance of a 3D NAND memory when a user only needs to change the code of a small unit stored in a sub-block of memory cells in the 3D NAND memory.

In the present technology, a set of word lines shared by a plurality of NAND strings can be divided into a first subset and a second subset of the set of word lines, allowing the sub-block of memory cells coupled to one of the first subset and the second subset to be erased, while inhibiting tunneling in memory cells coupled to the other one of the first subset and the second subset. Consequently, only some but not all memory cells in a block are erased in a sub-block erase operation, thus enabling faster timing specification for sub-block erase operations than for block erase operations and enhancing the performance of a 3D NAND memory.

FIG. 5 is a circuit diagram showing example NAND strings in an X-Y plane in a block of memory cells connected to a configuration of local and global word line drivers, in a 3D memory. The NAND strings correspond to four pages of memory cells: Page 0, Page 1, Page 2 and Page 3. The NAND strings can be disposed on the same layer of the 3D array like that of FIG. 2, sharing even and odd GSL lines for the even and odd pages, and having separate SSL lines coupled to global bit lines BL-N at even and odd bit line contact structures on opposing ends of the block like that shown in FIG. 2, and to even and odd common source CS lines 520 and 521. The strings are connected to the corresponding global bit lines BL-0 to BL-3 by respective first string select switches (e.g. 530, 531, 532 and 533), also referred to as SSL switches. The strings are connected to the even or odd common source line for the plane by respective second string select switches (e.g. 540, 541), also referred to as ground select switches. A plurality of NAND strings in a block of memory cells has channel lines between the first string select switches and the second string select switches, and shares a set of word lines (e.g. WL0-WL4, . . . WL(i−1), WL(bnd), WL(i+1), . . . WL59-WL63) between the first and second string select switches.

The memory includes a set of local word line drivers (e.g. 560-572), abbreviated as LWLD, that drives respective word lines in the set of word lines in a selected block of memory cells. The set of local word line drivers can include a first subset of the set of local word line drivers (e.g. 567-572) driving a first subset of the set of word lines (e.g. 551) including word lines WL(i+1), . . . WL59-WL63, a second subset of the set of local word line drivers (e.g. 560-565) driving a second subset of the set of word lines (e.g. 559) including word lines WL0-WL4, . . . WL(i−1), and a boundary word line driver (e.g. 566) driving a boundary word line (e.g. WL(bnd)) in the set of word lines between the first subset of the set of word lines and the second subset of the set of word lines.

The memory includes a set of global word lines, including first global word lines (e.g. 511g) connected to the first subset of the set of local word line drivers and to the second subset of the set of local word line drivers, and a second global word line (e.g. 516g) connected to the boundary word line driver. The memory includes a global word line driver (e.g. 511) that drives the N first global word lines 511g, in which there are N global word line signals provided in parallel for connection to selected blocks by the local word line decoder and local word line drivers in this example. Also, the memory includes a second global word line driver 516 producing a signal on second global word line 516g that drives the local driver for the boundary word line. The second global word line driver 516 can include circuitry configured to provide the boundary word line bias voltages to the boundary word line during sub-block erase, in addition to the bias voltages used for other operations.

Only one set of even and odd blocks is illustrated in this example. But the global word lines can connect to the local word line drivers for many blocks.

A global word line decoder (e.g. 590), abbreviated as GWL decoder, is connected to the global word line drivers using a conductor (e.g. 595) in a patterned conductor layer. The conductor can carry one or more output signals to the global word line drivers. A local word line decoder (e.g. 580), abbreviated as LWL decoder, is connected to the local word line drivers (e.g. 560-572) using conductors in patterned conductor layers, for connection of power signals, bias signals, address signals and/or other control signals to the local word line drivers. The connection from the local word line decoder 580 can include a first control signal line 581 carrying control signals to each of the local word line drivers in a first sub-set of word lines in the block, a second control signal line 582 carrying control signals for each of the local word line drivers in a second sub-set of word lines in the block, and a third control signal line 583 carrying a control signal for a boundary word line in the block, as explained in more details below.

A local word line driver (e.g. 571) can include an NMOS (N-type metal oxide semiconductor) transistor that has an input connected to a global word line (e.g. 511g) in the set of global word lines, an output connected to a word line (e.g. WL62) in the set of word lines, and a control gate connected to a control signal (e.g. from control signal line 581) from a local word line decoder (e.g. 580). A global word line driver (e.g. 511) can include a level shifter that shifts output voltage levels according to one or more output signals from a global word line decoder (e.g. 590). For instance, the level shifter can vary the output voltage levels according to requirements by sub-block erase operations, and according to requirements by read, write and block erase operations.

Representative sub-block erase bias voltages using the configuration of local and global word line drivers can be understood based on the following table.

| Signals | Voltage |
|---|---|
| BL | +11 V |
| SSL/GSL | +3 V |
| Local WL drivers for erasing | +15 V |
| Global word lines for erasing | −9 V |
| Local WL driver for boundary WL | 3V |
| Boundary WL | −2 V to +4 V |
| Local WL drivers for inhibiting | −9 V |
| Global word lines for inhibiting | −9 V |
| CSL | +11 V |

In FIG. 5, a channel-side erase voltage (e.g. +11V) can be applied to the channel lines of the NAND strings through the first string select switches (e.g. 530, 531, 532, 533) in the selected block, when the first string select switches are biased (e.g. at +3V) to connect the plurality of bit lines to different layers of channel lines in the NAND strings. A first global word line voltage (−9V) can be applied on the first global word lines (e.g. 511g), which are connected to the first subset of the set of local word line drivers, and the second subset of the set of local word line drivers. A first control voltage (e.g. +15V) can be applied, for example via the first control signal (e.g. from control signal line 581), to turn on local word line drivers (e.g. 567-572) for word lines in the first subset of the set of local word line drivers, providing the word line-side erase voltages, when the first global word line voltage (e.g. −9V) is applied to the first global word lines (e.g. 511g). The word line-side erase voltages (e.g. −9V) are applied to the first subset (e.g. 551) of the set including more than one member of the set of word lines to induce tunneling, such as hole tunneling, in memory cells coupled to the first subset of the set of word lines. A second control voltage (e.g. −9V) can be applied, for example via the second control signal (e.g. from control signal line 582), to turn off local word line drivers (e.g. 560-565) in the second subset of the set of local word line drivers. The first control voltage is different than the second control voltage, and the second control voltage matches the first global word line voltage, such that the second subset of the set of local word line drivers can be turned off quickly causing the word lines to float, and achieve an inhibit voltage by capacitive boosting due to voltage changes on the channel lines for inhibiting tunneling in memory cells coupled to a second subset of the set of word lines.

A second global word line voltage (e.g. +3V) can be applied on the second global word line (e.g. 516g), and a third control voltage (e.g. +3V) can be applied, for example on the third control signal line (e.g. 583), to turn on the boundary word line driver (e.g. 566) which is connected to the boundary word line (e.g. WL(bnd)). The third control voltage (e.g. +3V) is between the first control voltage (Vpp=15V) and the second control voltage (e.g. −9V).

Tunneling, such as hole tunneling, is inhibited in memory cells coupled to the second subset (e.g. 559) including more than one member of the set of word lines. Inhibiting tunneling can include floating word lines in the second subset when the channel-side erase voltage is applied to induce self-boosting. For instance, when local word line drivers (e.g. 560-565) of the word lines in the second subset are turned off, the word lines in the second subset that are connected to the local word line drivers become floating and thus inhibit tunneling in memory cells coupled to the second subset of the set of word lines.

FIG. 6 is a circuit diagram showing example NAND strings in an X-Y plane in a block of memory cells connected to an alternative configuration of local and global word line drivers, where the local word line control signals can be a single signal. The circuit shown in FIG. 6 is similar to the circuit shown in FIG. 5. Like elements in FIG. 6 are commonly referred to with like reference numerals as in FIG. 5.

The memory includes a set of global word lines, including first global word lines (e.g. 511g) connected to the first subset of the set of local word line drivers, a second global word line (e.g. 516g) connected to the boundary word line driver (e.g. 566), and third global word lines (e.g. 519g) connected to the second subset of the set of local word line drivers. The memory includes a first global word line driver (e.g. 511) that drives the first global word lines 511g, and a third global word line driver (e.g. 519) that drives the third global word lines 519g.

A global word line decoder (e.g. 590), abbreviated as GWL decoder, is connected to the global word line drivers using a conductor (e.g. 595) in a patterned conductor layer. The conductor can carry one or more address signals to the global word line drivers. A local word line decoder (e.g. 580), abbreviated as LWL decoder, is connected to the local word line drivers (e.g. 560-572) using conductors in patterned conductor layers, for connection of power signals, bias signals, address signals and/or other control signals to the local word line drivers. The connection can include a control signal line (e.g. 680), as explained in more details below.

Representative sub-block erase bias voltages using the alternative configuration of local and global word line drivers can be understood based on the following table.

| Signals | Voltage |
|---|---|
| BL | +11 V |
| SSL/GSL | +3 V |
| Local WL drivers for erasing | +4 V |
| Global word lines for erasing | −9 V |
| Local WL driver for boundary WL | +4 V |
| Boundary WL | −2 V to +4 V |
| Local WL drivers for inhibiting | +4 V |
| Global word lines for inhibiting | +4 V |
| CSL | +11 V |

In FIG. 6, a channel-side erase voltage (e.g. +11V) can be applied to the channel lines of the NAND strings through the first string select switches (e.g. 530, 531, 532, 533) in the selected block, when the first string select switches are biased (e.g. at +3V) to connect the plurality of bit lines to different layers of channel lines in the NAND strings. A first global word line voltage (−9V) can be applied on the first global word lines (e.g. 511g), which is connected to the first subset of the set of local word line drivers. A third global word line voltage (+4V) can be applied on the third global word lines (e.g. 519g), which are connected to the second subset of the set of local word line drivers. A control voltage (e.g. +4V) can be applied, for example via the control signal line (e.g. 680), to turn on local word line drivers (e.g. 567-572) for word lines in the first subset of the set of local word line drivers, providing the word line-side erase voltages, when the first global word line voltage (e.g. −9V) is applied to the first global word lines (e.g. 511g). The word line-side erase voltages (e.g. −9V) are applied to the first subset (e.g. 651) of the set including more than one member of the set of word lines to induce tunneling, such as hole tunneling, in memory cells coupled to the first subset of the set of word lines. The control voltage (e.g. +4V) can also be applied to turn off local word line drivers (e.g. 560-565) in the second subset of the set of local word line drivers. The first global word line voltage is different than the third global word line voltage, and the control voltage matches the third global word line voltage, such that the second subset of the set of local word line drivers can be turned off quickly for inhibiting tunneling in memory cells coupled to a second subset of the set of word lines.

A second global word line voltage (e.g. −2V to +4V) can be applied on the second global word line (e.g. 516g), and the control voltage (e.g. +4V) can be applied, for example on the control signal line (e.g. 680), to turn on the boundary word line driver (e.g. 566) which is connected to the boundary word line (e.g. WL(bnd)). The second global word line voltage (−2 to +4V) can be between the first global word line voltage (−9V) and the third global word line voltage (+4V).

Tunneling, such as hole tunneling, is inhibited in memory cells coupled to the second subset (e.g. 659) including more than one member of the set of word lines. Inhibiting tunneling can include floating word lines in the second subset when the channel-side erase voltage is applied to induce self-boosting. For instance, when local word line drivers (e.g. 560-565) of the word lines in the second subset are turned off, the word lines in the second subset that are connected to the local word line drivers become floating and thus inhibit tunneling in memory cells coupled to the second subset of the set of word lines.

In embodiments of the sub-block erase technology, more than one, or all, of the global word line drivers and local word line drivers can be designed to provide the boundary bias voltages. In these embodiments, the size of a sub-block in an erase operation can be defined logically, in response to a command from a source external or internal to the memory, or to a configuration word stored on the memory.

Figure 7:
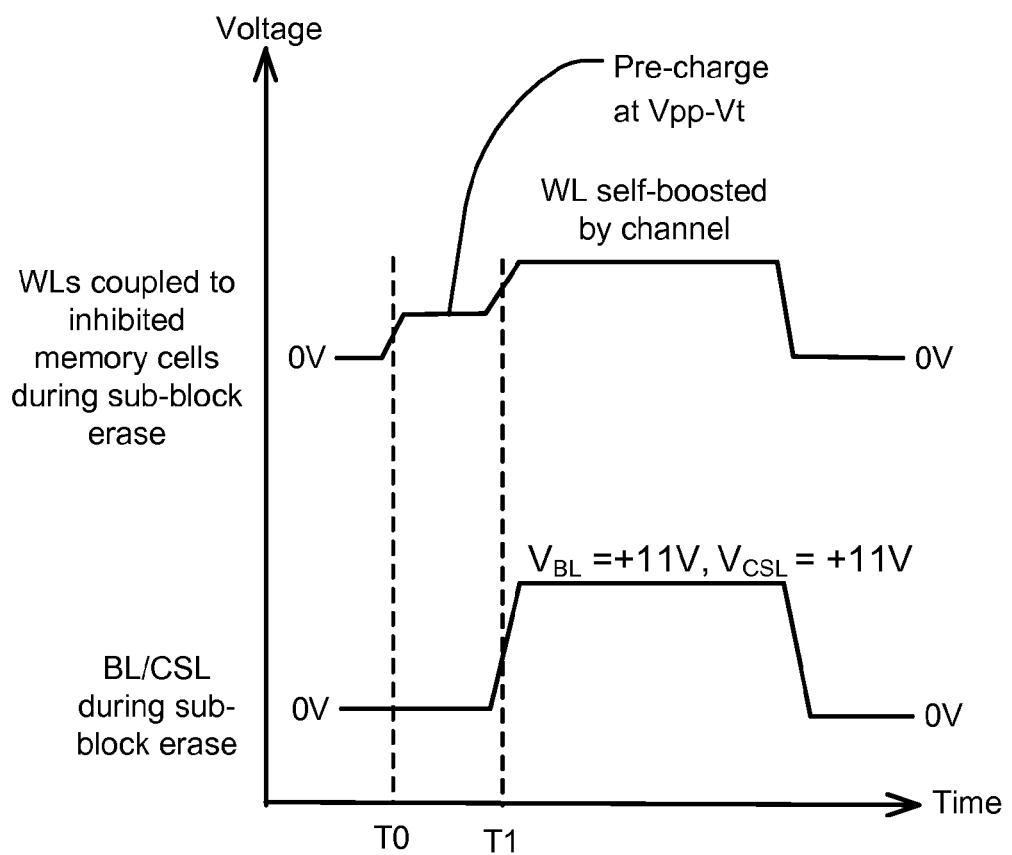
FIG. 7 is a timing diagram, showing pre-charging of word lines coupled to inhibited memory cells during sub-block erase using the alternative configuration of local and global word line drivers shown in FIG. 6.

FIG. 7 is a timing diagram, showing pre-charging of word lines coupled to inhibited memory cells during sub-block erase using the alternative configuration of local and global word line drivers shown in FIG. 6. As shown in FIG. 7, the word lines in the second subset of the set of word lines can be pre-charged at time T0 by the voltage difference (Vpp−Vt) between the bias voltage Vpp (e.g. +4V) applied to the local word line drivers (e.g. 560-565) for the second subset (e.g. 659) and the threshold voltages of the local word line drivers Vt, before the channel-side erase voltage (e.g. BL/CSL) is applied to the channel lines of the NAND strings at time T1.

Figure 8:
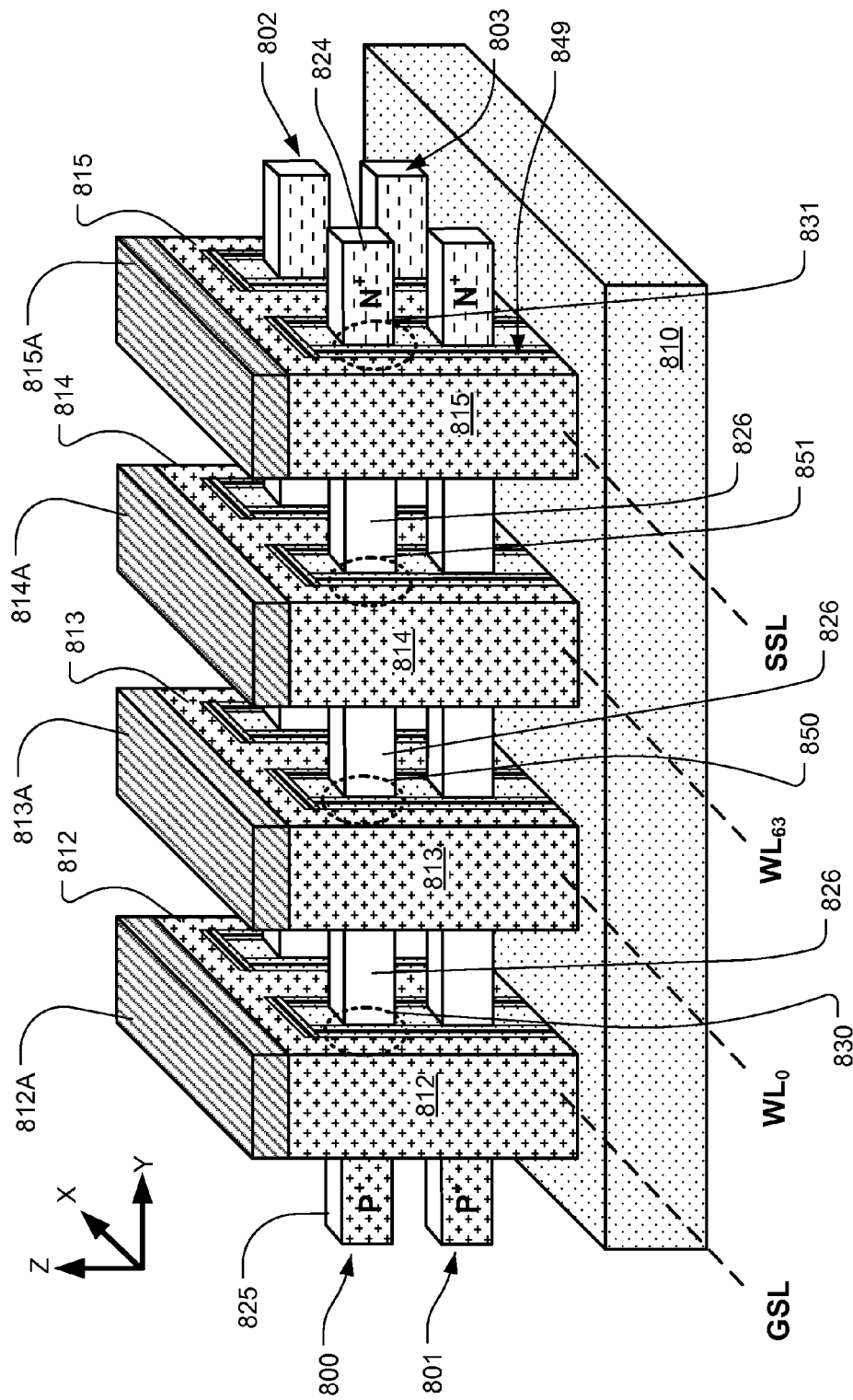
FIG. 8 illustrates a dual-mode, 3D vertical gate NAND memory structure.

FIG. 8 illustrates a dual-mode, 3D vertical gate NAND memory structure. The dual-mode, 3D vertical gate NAND memory structure is described in commonly owned U.S. patent application Ser. No. 14/209,962 filed 13 Mar. 2014, entitled "Dual-Mode Memory Devices and Methods for Operating Same," which is hereby incorporated by reference as if fully set forth herein. In embodiments utilizing the P+ source terminal as illustrated, the channel potential during an erase can more readily be driven to a uniform level across the length of the NAND string.

The 3D memory device in this example includes a plurality of stacks, in the form of multiple channel lines 800, 801, 802, 803 of semiconductor material separated by insulating material (removed for the purposes of the drawing between the word line structures). The channel lines 800-803 of semiconductor material each comprise a multi-gate channel region between a p-type terminal region (e.g. 825) on one end and an n-type terminal region (e.g. 824) on the other end. A plurality of conductive lines 812, 813, 814, 815 is arranged to cross over the stacks of channel lines. The regions 826 between the conductive lines 812, 813, 814, 815 are junction free, and can have the same doping profile, or a similar doping profile, as regions in the channel lines 800, 801, 802, 803 beneath the conductive lines. A dielectric charge storage structure 849 is disposed on the sidewalls of the stacks and at the cross points between the channel lines 800-803 and the conductive lines 812-815. A first conductive line 812, between the word lines and the p-type terminal regions in this example, is configured as a ground select line GSL. A last conductive line 815, between the word lines and the n-type terminal regions in this example, is configured as a string select line SSL. The conductive lines in between, of which only two (813, 814) are illustrated, are configured as word lines. In a representative embodiment, there may be for example 64 word lines crossing a single dual-mode, multi-gate channel line.

In the illustration, a layer 812A, 813A, 814A, 815A of silicide or other material to assist conductivity is formed on a top surface of the conductive lines. The conductive lines also include vertical extensions between the stacks that form side gate structures for the dual-mode channel lines.

The charge storage structure 849 is disposed at least in the cross points in which memory cells are formed. The charge storage layer structure can comprise a multilayer dielectric charge storage structure, such as a SONOS-like structure. One dielectric charge storage structure which can be utilized is known as bandgap engineered SONOS, or "BE-SONOS." A BE-SONOS charge storage structure can include a multilayer tunneling layer, such as a layer of silicon oxide about 1 to 2 nm thick, a layer of silicon nitride about 2 to 3 nm thick and a layer of silicon oxide about 2 to 3 nm thick. A BE-SONOS structure includes a dielectric layer for storing charge on the multilayer tunneling layer, such as a layer of silicon nitride about 5 to 7 nm thick. Also, a BE-SONOS structure includes a dielectric blocking layer for blocking charge leakage on the charge storage layer, such as a layer of silicon oxide about 5 to 8 nm thick. Other materials may be utilized as well in the BE-SONOS stack.

As a result of this structure, memory cells (e.g. 850, 851) are formed in a 3D array in the cross points between the vertical extensions of the conductive lines 813, 814 and side surfaces of the channel lines 800-803. A string select switch 831 and a ground select switch 830 are formed in the cross points between the vertical extensions of the conductive lines 815 and 812, respectively.

The structure can be configured so that the drain side of each of the dual-mode, multi-gate channel lines has an N+ type junction (terminal region 824) while the source side has a P+ type junction (terminal region 825). Inside the array, the channel regions of the channel lines are undoped or lightly doped, and junction free.

The memory cells along each of the channel lines 800-803 in this structure can be characterized as a dual-mode, multi-gate NAND channel line.

The p-channel and n-channel modes of operation of the channel can be controlled by the polarity of the pass gate voltages applied to unselected word lines, while a selected word line is controlled according to the selected operation, e.g. read, program or erase.

Figure 9:
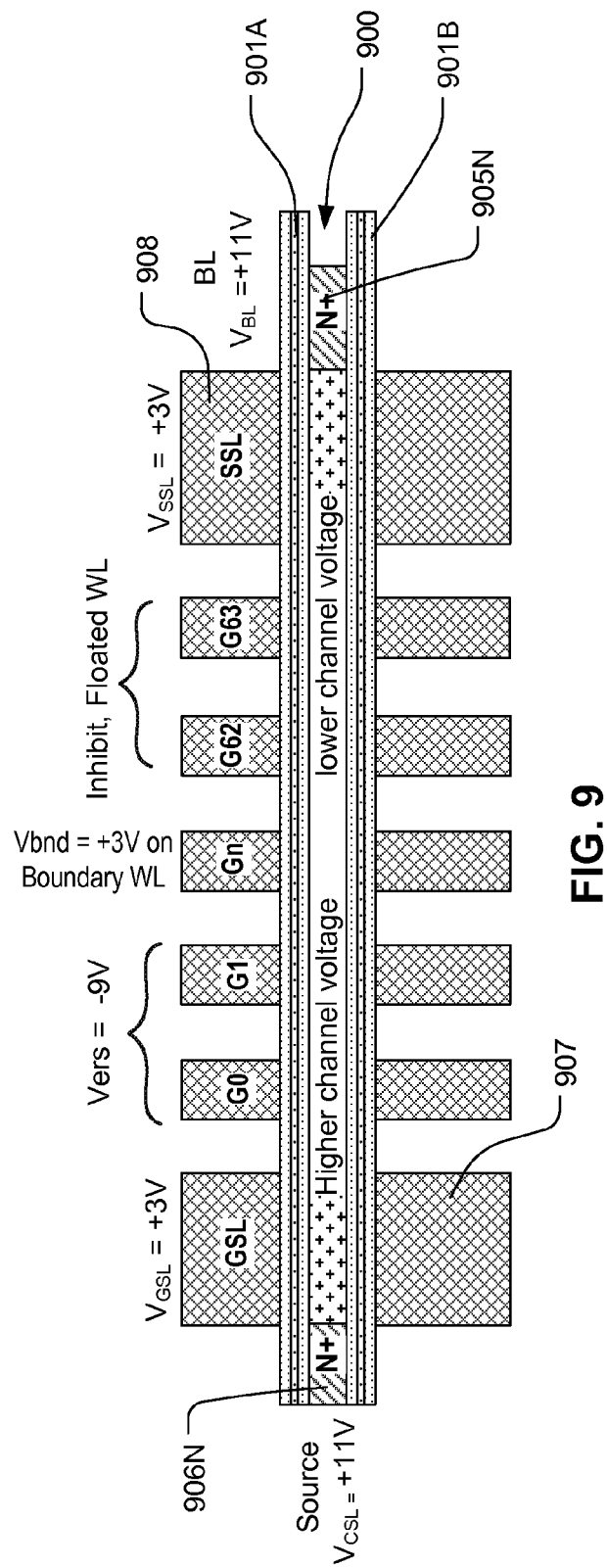
FIG. 9 shows a plan view diagram of a channel line configured as a NAND string.

FIG. 9 shows a plan view diagram of a channel line configured as a NAND string. FIG. 9 illustrates example bias conditions for sub-block erase operations in a conventional memory structure, where a channel line includes a channel region disposed between two N+ terminals.

Referring to FIG. 9, the channel line 900 includes a channel region 905, disposed between an N+ terminal 906N and another N+ terminal 905N. A dielectric charge trapping layer 901A is disposed on one side of the channel line 900, and a dielectric charge trapping layer 901B is disposed on the other side of the channel line 900. The GSL switch is formed by the GSL dual gate structure (e.g. 907) adjacent the N+ terminal 906N. The SSL switch is formed by the SSL dual gate structure (e.g. 908) adjacent the N+ terminal 905N. The N+ terminal 906N and the N+ terminal 905N can overlap with the GSL and SSL dual gate structures, respectively, or be aligned as illustrated, as suits a particular implementation. The amount of overlap can have an effect on the character of the ambipolar operation, and on the amount of current in the devices. The channel line 900 passes through the SSL switch at one end, and passes through the GSL switch at another end. A set of word lines is disposed between the SSL switch and the GSL switch.

The set of word lines forms two-sided gate structures G0 to Gn−1, Gn, and Gn+1 to G63. A boundary word line in the set of word lines can be connected to gate structure Gn. For sub-block erase operations, as illustrated in FIG. 9, a channel-side erase voltage $V_{BL}$ (e.g. +11V) can be applied to a plurality of bit lines connected to N+ terminals at the end of the SSL switch (905N), and a source-side voltage $V_{CSL}$ (e.g. +11V) can be applied to the plurality of bit lines connected to N+ terminals at the end of the GSL switch (906N). The SSL switches of the plurality of bit lines can be biased at voltage $V_{SSL}$ (e.g. +3V) to connect the plurality of bit lines to different layers of channel lines in the NAND strings. The GSL switches of the plurality of bit lines can be biased at voltage $V_{GSL}$ (e.g. +3V) to connect the source line at a source-side voltage $V_{CSL}$ (e.g. +11V) to different layers of channel lines in the NAND strings. A bias voltage Vbnd (e.g. +3V) can be applied on the boundary word line connected to gate structure Gn, to induce boundary conditions. A word line-side erase voltage Vers (e.g. −9V) can be applied to a selected subset including more than one member of the set of word lines on one side of the boundary word line. As a result of the negative voltages on word lines in the selected subset of the set of word lines, hole tunneling can be induced in memory cells coupled to the selected subset.

As used in the present specification, word lines in a selected subset of the set of word lines in a selected block are coupled to memory cells to be erased, while word lines in an unselected subset of the set of word lines in the selected block are coupled to memory cells not to be erased, where word lines in the selected subset and in the unselected subset of the set of word lines are shared by NAND strings in the selected block.

A conventional block erase operation that uses GIDL (gate induced drain leakage) currents can be performed in a conventional memory structure where the drain side of a channel line has an N+ type terminal while the source side of the channel line also has a N+ type terminal, as shown in FIG. 9. GIDL currents are generated at the SSL switch at one end of a channel line and at the GSL switches at the other end of the channel line. Electron and hole pairs are generated by GIDL, where holes are swept into the NAND string. The accumulation of holes at the channel then raise up the channel potential, leading to the subsequent -FN hole tunneling injection at the devices. The channel potential can be uniform along the length of the channel line because the word lines coupled to memory cells on the channel line are applied the same word line bias, and the bit lines and source lines coupled to the memory cells are applied the same bit line and source line bias.

In a sub-block erase operation, a bias scheme using GIDL currents like that of the conventional block erase operation may be used. However, the channel potential along the channel line may be non-uniform and cause hot carrier disturb, because the channel potential for the selected subset for erasing may be different from the channel potential for the unselected subset for inhibiting, as a negative erase voltage (e.g. −9V) is applied to the selected subset while the unselected subset is floated. A sub-block erase operation using the conventional memory structure can be slow due to the GIDL generated minority carriers (e.g. holes).

Figure 10:
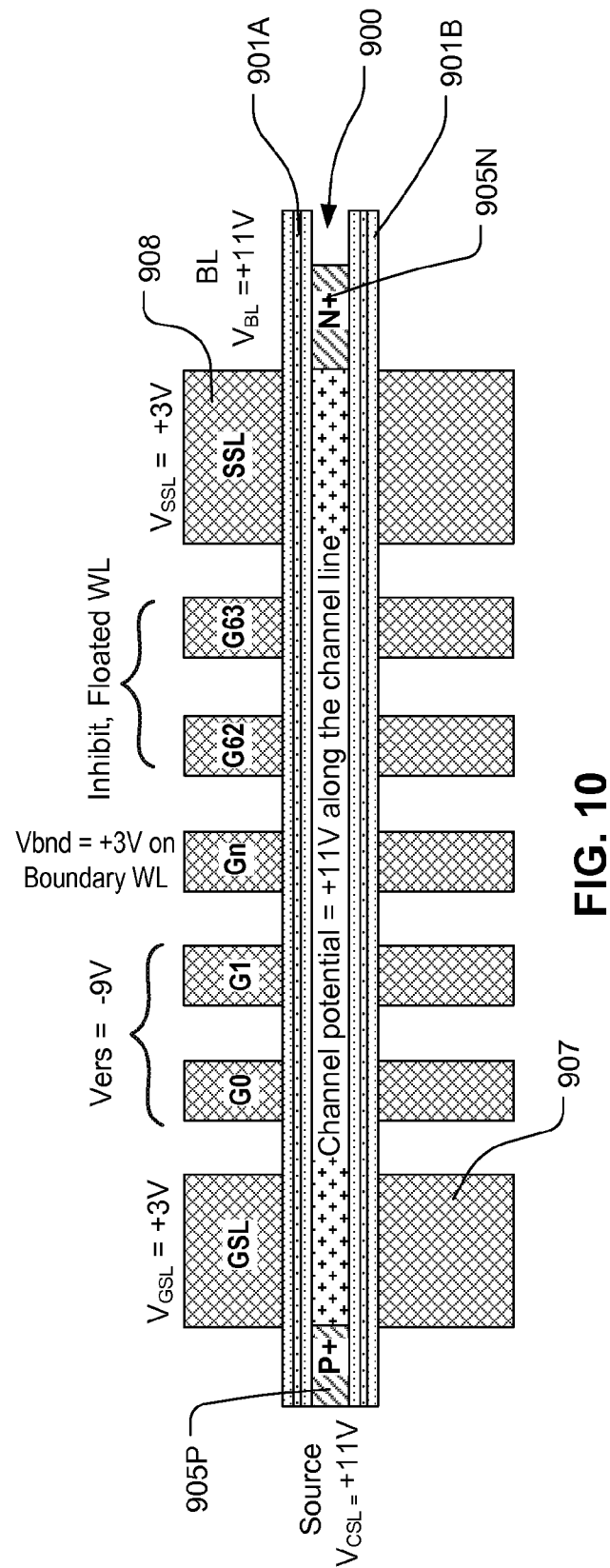
FIG. 10 is a plan view diagram of a dual-mode channel line as in a dual-mode memory structure, configured as a NAND string.

FIG. 10 is a plan view diagram of a dual-mode channel line as in a dual-mode memory structure, configured as a NAND string, like the channel lines in the memory structure shown in FIG. 8. Like elements in FIG. 10 are commonly referred to with like reference numerals as in FIG. 9. FIG. 10 illustrates example bias conditions for sub-block erase operations in a dual-mode memory structure, where a channel line includes a channel region disposed between a P+ terminal and an N+ terminal.

Referring to FIG. 10, the channel line 900 includes a channel region 905, disposed between a P+ terminal 1005P and an N+ terminal 905N. A dielectric charge trapping layer 901A is disposed on one side of the channel line 900, and a dielectric charge trapping layer 901B is disposed on the other side of the channel line 900. The GSL switch is formed by the GSL dual gate structure (e.g. 907) adjacent the P+ terminal 1005P. The SSL switch is formed by the SSL dual gate structure (e.g. 908) adjacent the N+ terminal 905N. The P+ terminal 1005P and the N+ terminal 905N can overlap with the GSL and SSL dual gate structures, respectively, or be aligned as illustrated, as suits a particular implementation. The amount of overlap can have an effect on the character of the ambipolar operation, and on the amount of current in the devices. The channel line 900 passes through the SSL switch at one end, and passes through the GSL switch at another end. A set of word lines is disposed between the SSL switch and the GSL switch.

The set of word lines forms two-sided gate structures G0 to Gn−1, Gn, and Gn+1 to G63. A boundary word line in the set of word lines can be connected to gate structure Gn. For sub-block erase operations, as illustrated in FIG. 10, a channel-side erase voltage $V_{BL}$ (e.g. +11V) can be applied to a plurality of bit lines connected to N+ terminals, such as the N+ terminal 905N. The SSL switches of the plurality of bit lines can be biased at voltage $V_{SSL}$ (e.g. +3V) to connect the plurality of bit lines to different layers of channel lines in the NAND strings. The GSL switches of the plurality of bit lines can be biased at voltage $V_{GSL}$ (e.g. +3V) to connect the source line at a source-side voltage $V_{CSL}$ (e.g. +11V) to different layers of channel lines in the NAND strings. A bias voltage Vbnd (e.g. +3V) can be applied on the boundary word line connected to gate structure Gn, to induce boundary conditions. A word line-side erase voltage Vers (e.g. −9V) can be applied to a selected subset including more than one member of the set of word lines on one side of the boundary word line. As a result of the negative voltages on word lines in the selected subset of the set of word lines, hole tunneling can be induced in memory cells coupled to the selected subset.

In a dual-mode memory structure, the structure can be configured so that the drain side of each of the dual-mode, multi-gate channel lines (e.g. 900) has an N+ type terminal (e.g. 905N) while the source side has a P+ type terminal (e.g. 1005P). When a source-side voltage (e.g. $V_{CSL}$=+11V) is applied to the source side of the dual-mode channel line, the P+ type terminal at the source side provides holes to the channel line, so the channel line is turned on in the p-channel mode when Vg is negative. Holes from the P+ type terminal then drift along the channel line, instantly raising the channel potential along the dual-mode channel line to substantially the source-side voltage. Furthermore, the channel potential is independent of the bias on the word lines coupled to the channel line. Consequently the channel potential along the dual-mode channel line can be substantially uniform and suppress hot carrier disturb during sub-block erase operations, even when different bias voltages are applied on the word lines coupled to the channel line.

Figure 11:
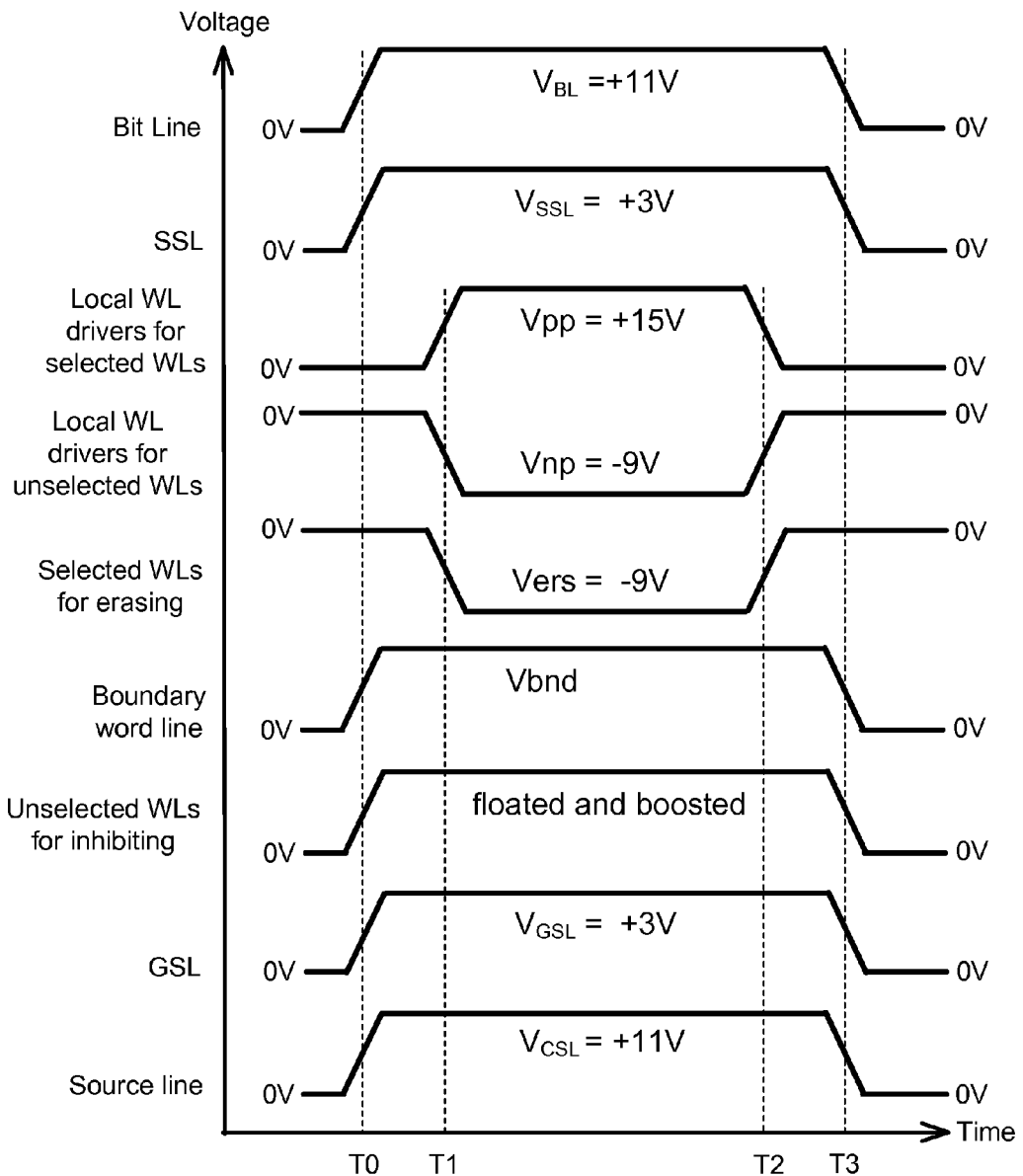
FIG. 11 is a timing diagram suitable for use with the sub-block erase operations as described in connection with the circuit shown in FIG. 5.

FIG. 11 is a timing diagram suitable for use with the sub-block erase operations as described in connection with the circuit shown in FIG. 5. As described for FIG. 5, a block of memory cells includes a plurality of NAND strings that have channel lines between first string select switches and second string select switches, and in which the plurality of NAND strings shares a set of word lines between the first and second string select switches.

At the beginning of a sub-block erase cycle, before time T0, voltages on the bit lines, the source line, the SSL, the GSL, the selected word lines for erasing, the unselected word lines for inhibiting, and the boundary word line can be at initial values such as 0V. At time T0, a channel-side erase voltage (e.g. $V_{BL}$=+11V) is applied to the channel lines of the NAND strings through the first string select switches (e.g. SSL switches) in a selected block, when voltage on the SSL switches transitions to about $V_{SSL}$ (e.g. +3V). At time T0, a source-side voltage (e.g. $V_{CSL}$=+11V) is applied to the channel lines of the NAND strings through the second string select switches (e.g. GSL switches), when voltage on the GSL switches transitions to about $V_{GSL}$ (e.g. +3V).

At time T0, a bias voltage Vbnd is applied on the boundary word line in the set of word lines in the selected block, to induce boundary conditions, between the selected subset on one side of the boundary word line and the unselected subset on another side of the boundary word line.

At time T1 subsequent to time T0, a first control voltage (e.g. Vpp=+15V) is applied to turn on local word line drivers for the selected subset of the set of word lines, to apply word line-side erase voltages (e.g. Vers=−9V) to the selected subset of the set of word lines, to induce tunneling, such as hole tunneling, in memory cells coupled to the selected subset. Since the local word line drivers (e.g. 560-565, FIG. 5) for the unselected subset (e.g. 559, FIG. 5) are applied the same bias voltage (e.g. Vnp=−9V) as applied to the third global word lines (e.g. 519g, FIG. 6) connected to the local word line drivers (e.g. 560-565, FIG. 5), the local word line drivers for the unselected subset can be quickly turned off, thus causing the word lines in the unselected subset to float, and then self-boost by the raised channel potential caused by the channel-side erase voltage applied to the channel lines of the NAND strings. Consequently, tunneling such as hole tunneling is inhibited in memory cells coupled to the unselected subset of the set of word lines, when the channel-side erase voltage is applied to induce self-boosting. At time T2, voltages on the selected subset of the set of word lines can return to about 0V. At time T3, the sub-block erase cycle ends, and other voltages can also return to about 0V.

Figure 12:
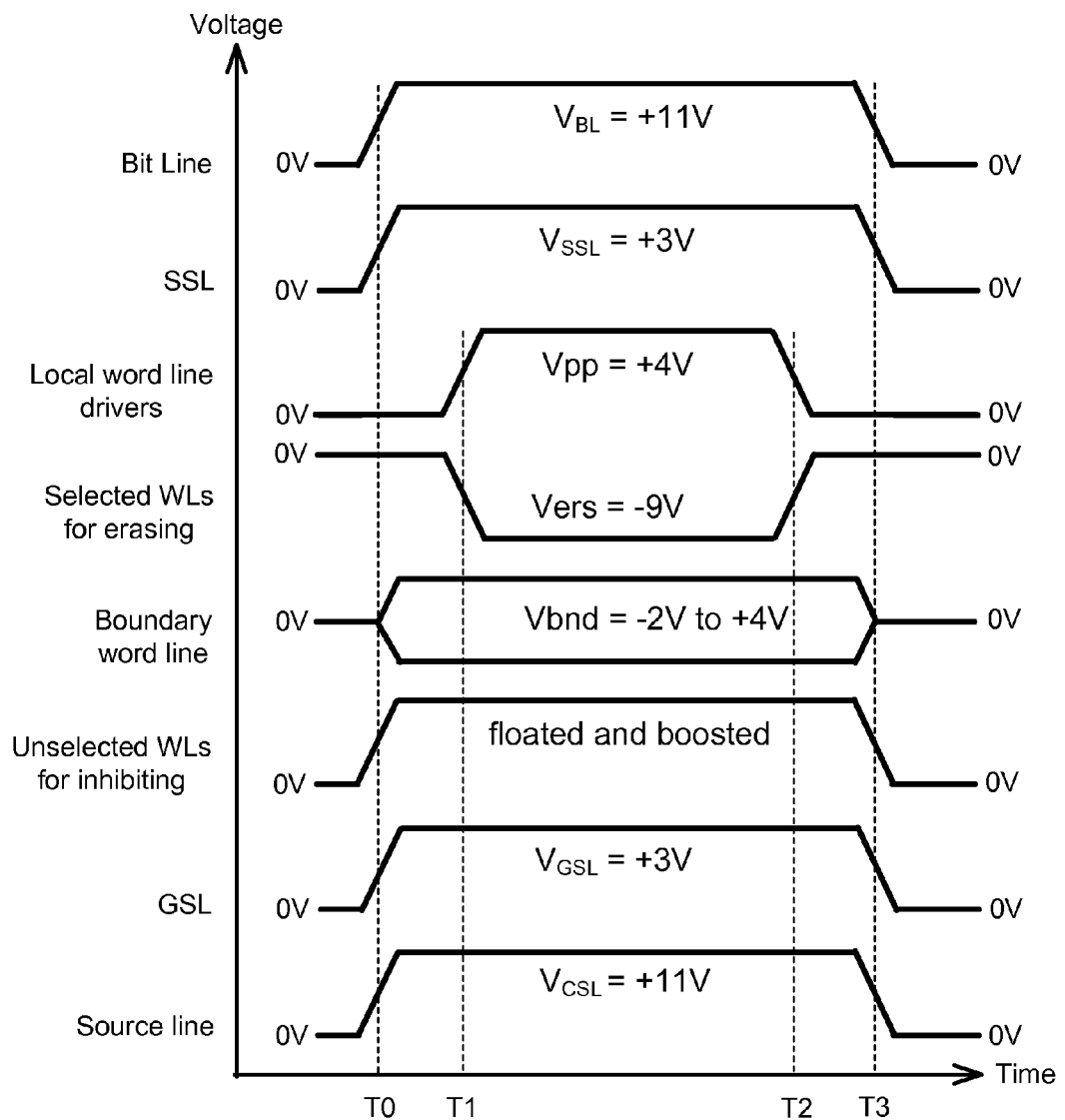
FIG. 12 is a timing diagram suitable for use with the sub-block erase operations as described in connection with the circuit shown in FIG. 6.

FIG. 12 is a timing diagram suitable for use with the sub-block erase operations as described in connection with the circuit shown in FIG. 6. As described for FIG. 6, a block of memory cells includes a plurality of NAND strings that have channel lines between first string select switches and second string select switches, and in which the plurality of NAND strings shares a set of word lines between the first and second string select switches.

At the beginning of a sub-block erase cycle, before time T0, voltages on the bit lines, the source line, the SSL, the GSL, the local word line drivers, the selected word lines for erasing, the unselected word lines for inhibiting, and the boundary word line can be at initial values such as 0V. At time T0, a channel-side erase voltage (e.g. $V_{BL}$=+11V) is applied to the channel lines of the NAND strings through the first string select switches (e.g. SSL switches) in a selected block, when voltage on the SSL switches transitions to about $V_{SSL}$ (e.g. +3V). At time T0, a source-side voltage (e.g. $V_{CSL}$=+11V) is applied to the channel lines of the NAND strings through the second string select switches (e.g. GSL switches), when voltage on the GSL switches transitions to about $V_{GSL}$ (e.g. +3V).

At time T0, a control voltage (e.g. Vpp=+4V) is applied to turn on local word line drivers (e.g. 560-572) for word lines in the selected subset (e.g. WL(i+1), WL59-WL63), for the boundary word line (e.g. WL(bnd)), and for word lines in the unselected subset (e.g. WL0-WL4, WL(i−1)). At time T0, a bias voltage Vbnd (e.g. −2V to +4V) is applied on the boundary word line in the set of word lines in the selected block, to induce boundary conditions, between the selected subset on one side of the boundary word line and the unselected subset on another side of the boundary word line.

At time T0, a global word line voltage (e.g. +4V) is applied to third global word lines (e.g. 519g, FIG. 6) which in turn are connected to local word line drivers (e.g. 560-565, FIG. 6) that drive word lines in an unselected subset (e.g. 659, FIG. 6) of the set of word lines. Since the local word line drivers (e.g. 560-565, FIG. 6) for the unselected subset (e.g. 659, FIG. 6) are applied the same bias voltage (e.g. +4V) as applied to the third global word lines (e.g. 519g, FIG. 6) connected to the local word line drivers, the local word line drivers for the unselected subset can be quickly turned off, thus causing the word lines in the unselected subset to float, and then self-boost by the raised channel potential caused by the channel-side erase voltage applied to the channel lines of the NAND strings. Consequently, tunneling such as hole tunneling is inhibited in memory cells coupled to the unselected subset.

At time T1 subsequent to time T0, word line-side erase voltages (e.g. Vers=−9V) are applied to a selected subset (e.g. 651, FIG. 6) including more than one member of the set of word lines shared by NAND strings in the selected block, to induce tunneling, such as hole tunneling, in memory cells coupled to the selected subset. At time T2, the word line-side erase voltage Vers can return to about 0V. At time T3, the sub-block erase cycle ends, and other voltages can also return to about 0V.

Figure 13:
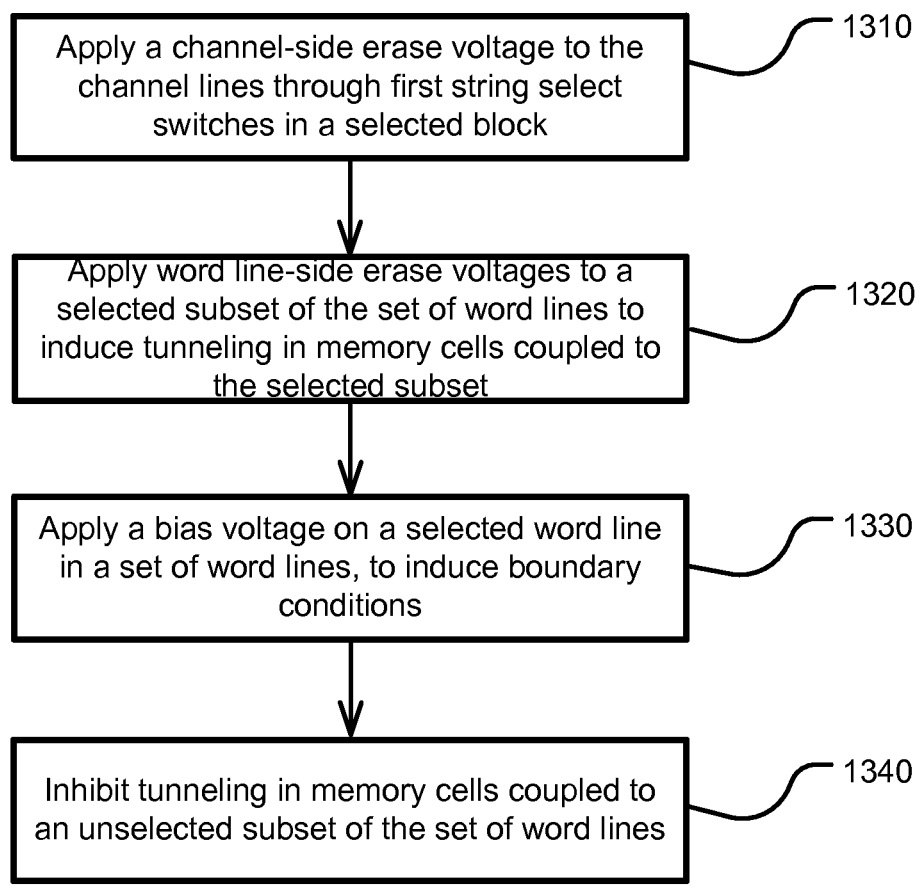
FIG. 13 is a flowchart of a procedure which can be used for sub-block erase operations as described herein.

FIG. 13 is a flowchart of a procedure which can be used for sub-block erase operations as described herein. A controller, such as implemented as a state machine 119 in an integrated circuit 100 (FIG. 1), can carry out the various operations in the procedure.

A sub-block erase command can be received from a source external to an integrated circuit (e.g. 100, FIG. 1), such as an integrated circuit memory, or inside the integrated circuit, to erase memory cells coupled to a selected subset of the set of word lines in the selected block. In response to the command, steps illustrated in FIG. 13 can be executed.

At Step 1310, a channel-side erase voltage (e.g. +11V) can be applied to the channel lines of the NAND strings through the first string select switches in a selected block, such as SSL switches 530, 531, 532 and 533 as shown in FIGS. 5 and 6. A source line voltage (e.g. +11V) can also be applied to the channel lines of the NAND strings through the second string select switches in the selected block, such as GSL switches 540 and 541 as shown in FIGS. 5 and 6. At Step 1320, a word line-side erase voltage (e.g. −9V) can be applied to a selected subset including more than one member of the set of word lines shared by NAND string in the selected block, on one side of the boundary word line (e.g. WL(bnd)), to induce tunneling such as hole tunneling in memory cells coupled to the selected subset. At Step 1330, a bias voltage can be applied on the boundary word line (e.g. WL(bnd), FIGS. 5 and 6) in the set of word lines, to induce boundary conditions, between the selected subset on one side of the boundary word line and the unselected subset on another side of the boundary word line.

At Step 1340, tunneling, such as hole tunneling, can be inhibited in memory cells coupled to an unselected subset including more than one member of the set of word lines. Inhibiting tunneling can include floating word lines in the unselected subset when the channel-side erase voltage is applied to induce self-boosting. Floating word lines in the unselected subset is described in one implementation as shown in FIG. 5, and in another implementation as shown in FIG. 6.

The boundary word line may be disturbed during a sub-block erase operation. In one implementation, the boundary word line can be used as a dummy word line so that no data is stored in memory cells coupled to the boundary word line. In an alternative implementation, data can be stored in memory cells coupled to the boundary word line in a selected block, moved to another block in the memory before a sub-block erase operation is executed using the boundary word line in the selected block, and moved back to the memory cells coupled to the boundary word line in the selected block after the sub-block erase operation is executed. In yet another embodiment, data stored in memory cells coupled to the boundary word line in a selected block may be disturbed but not lost during a sub-block erase operation, such that an ECC (error correcting code) operation can detect and correct errors in memory cells coupled to the boundary word line.

Embodiments of the sub-block erase operations have been described with reference to the vertical gate architecture shown in FIG. 3. The operations can be tuned for a variety of 3-D memory architectures.

Also, embodiments of the sub-block erase operations have been described with reference to flash memory. The operations can be tuned for other memory cell types as well.

While the present technology is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the technology and the scope of the following claims.

The invention claimed is:

1. A method of operating a NAND array that includes a plurality of blocks of memory cells, wherein a block of memory cells in the plurality of blocks comprises a plurality of NAND strings having channel lines between first string select switches and second string select switches, and in which the plurality of NAND strings shares a set of word lines between the first and second string select switches, comprising:
   applying a channel-side erase voltage to the channel lines of the NAND strings through the first string select switches in a selected block;
   applying word line-side erase voltages to a selected subset of the set of word lines shared by NAND strings in the selected block to induce tunneling in memory cells coupled to the selected subset, the selected subset including more than one member of the set of word lines;
   inhibiting tunneling in memory cells coupled to an unselected subset of the set of word lines shared by NAND strings in the selected block, the unselected subset including more than one member of the set of word lines;
   applying a first control voltage to turn on word line drivers for word lines in the selected subset; and
   applying a second control voltage to turn off word line drivers for word lines in the unselected subset, when applying a global word line voltage matching the second control voltage to inputs of the word line drivers for word lines in the unselected subset,
   wherein the first control voltage is different than the second control voltage.

2. The method of claim 1, wherein said inhibiting includes floating word lines in the unselected subset when applying the channel-side erase voltage.

3. The method of claim 1, comprising:
   applying a bias voltage on a boundary word line in the set of word lines, to induce boundary conditions, between the selected subset on one side of the boundary word line and the unselected subset on another side of the boundary word line.

4. The method of claim 3, wherein the boundary conditions include electric fields for generation of holes.

5. The method of claim 3, comprising:
   applying a third control voltage to turn on a word line driver for the boundary word line when applying the bias voltage on the boundary word line,
   wherein the third control voltage is between the first control voltage and the second control voltage.

6. The method of claim 1, wherein the channel lines include a drain side with an N+ type terminal connected to the first string select switches, and a source side with a P+ type terminal connected to the second string select switches, comprising:
   applying a source-side voltage to the source side of the channel lines, providing holes to the channel lines, and raising a channel potential along the channel lines.

7. The method of claim 1, comprising:
executing said applying a channel-side erase voltage, said applying word line-side erase voltages, and said inhibiting, in response to a command to erase memory cells coupled to the selected subset of the set of word lines in the selected block.

8. A method of operating a NAND array that includes a plurality of blocks of memory cells, wherein a block of memory cells in the plurality of blocks comprises a plurality of NAND strings having channel lines between first string select switches and second string select switches, and in which the plurality of NAND strings shares a set of word lines between the first and second string select switches, comprising:
applying a channel-side erase voltage to the channel lines of the NAND strings through the first string select switches in a selected block;
applying word line-side erase voltages to a selected subset of the set of word lines shared by NAND strings in the selected block to induce tunneling in memory cells coupled to the selected subset, the selected subset including more than one member of the set of word lines; and
inhibiting tunneling in memory cells coupled to an unselected subset of the set of word lines shared by NAND strings in the selected block, the unselected subset including more than one member of the set of word lines, including
applying a control voltage to turn on word line drivers for word lines in the selected subset; and
applying the control voltage to turn off word line drivers for word lines in the unselected subset, when applying a global word line voltage matching the control voltage to inputs of the word line drivers for word lines in the unselected subset.

9. The method of claim 8, comprising:
applying a bias voltage on a boundary word line in the set of word lines, to induce boundary conditions, between the selected subset on one side of the boundary word line and the unselected subset on another side of the boundary word line;
applying the control voltage to turn on a word line driver for the boundary word line,
wherein the bias voltage is between the word line-side erase voltage and the global word line voltage.

10. A memory, comprising:
a NAND array that includes a plurality of blocks of memory cells, wherein a block of memory cells in the plurality of blocks comprises a plurality of NAND strings having channel lines between first string select switches and second string select switches, and in which the plurality of NAND strings shares a set of word lines between the first and second string select switches;
a set of local word line drivers driving respective word lines in the set of word lines in a selected block, including a first subset of the set of local word line drivers driving the first subset of the set of word lines, a second subset of the set of local word line drivers driving the second subset of the set of word lines, and a boundary word line driver driving a boundary word line in the set of word lines between the first subset of the set of word lines and the second subset of the set of word lines;
a set of global word lines, including first global word lines connected to the first subset of the set of local word line drivers, and a second global word line connected to the boundary word line driver; and
a controller coupled to the memory cells in the selected block, including:
logic to apply a channel-side erase voltage to the channel lines of the NAND strings through the first string select switches in the selected block;
logic to apply word line-side erase voltages to a first subset of the set of word lines shared by NAND strings in the selected block to induce tunneling in memory cells coupled to the first subset, the first subset including more than one member of the set of word lines; and
logic to inhibit tunneling in memory cells coupled to a second subset of the set of word lines shared by NAND strings in the selected block, the second subset including more than one member of the set of word lines.

11. The memory of claim 10, wherein the first global word lines are connected to the second subset of the set of local word line drivers, including a first global word line driver driving the first global word lines.

12. The memory of claim 10, wherein the set of global word lines includes third global word lines connected to the second subset of the set of local word line drivers, including a first global word line driver driving the first global word lines, and a third global word line driver driving the third global word lines.

13. The memory of claim 10, the controller including:
logic to apply a first global word line voltage on the first global word lines;
logic to apply a first control voltage to turn on the first subset of the set of local word line drivers, providing the word line-side erase voltages; and
logic to apply a second control voltage to turn off the second subset of the set of local word line drivers,
wherein the first control voltage is different than the second control voltage, and the second control voltage matches the first global word line voltage.

14. The memory of claim 13, the controller further including:
logic to apply a second global word line voltage on the second global word line; and
logic to apply a third control voltage to turn on the boundary word line driver,
wherein the third control voltage is between the first control voltage and the second control voltage.

15. The memory of claim 10, wherein the set of global word lines includes third global word lines connected to the second subset of the set of local word line drivers, the controller including:
logic to apply a first global word line voltage on the first global word lines;
logic to apply a third global word line voltage on the third global word lines; and
logic to apply a control voltage to turn on the first subset of the set of local word line drivers, providing the word line-side erase voltages, and to turn off the second subset of the set of local word line drivers,
wherein the first global word line voltage is different than the third global word line voltage, and the control voltage matches the third global word line voltage.

16. The memory of claim 15, the controller further including:
logic to apply a second global word line voltage on the second global word line; and logic to apply the control voltage to turn on the boundary word line driver,
wherein the second global word line voltage is between the first global word line voltage and the third global word line voltage.

17. The memory of claim 10, wherein the channel lines include a drain side with an N+ type terminal connected to the first string select switches, and a source side with a P+ type terminal connected to the second string select switches, the controller including:
   logic to apply a source-side voltage to the source side of the channel lines, providing holes to the channel lines, and raising a channel potential along the channel lines.

18. The memory of claim 10, wherein the controller is configured to execute said logic to apply a channel-side erase voltage, said logic to apply word line-side erase voltages, and said logic to inhibit, in response to a command to erase memory cells coupled to the first subset of the set of word lines in the selected block.

\* \* \* \* \*